(12) United States Patent
Matsuki et al.

(10) Patent No.: US 8,994,153 B2
(45) Date of Patent: Mar. 31, 2015

(54) SEMICONDUCTOR DEVICE HAVING ANTENNA ELEMENT AND METHOD OF MANUFACTURING SAME

(75) Inventors: Hirohisa Matsuki, Yokohama (JP); Masao Sakuma, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/494,408

(22) Filed: Jun. 12, 2012

(65) Prior Publication Data

US 2013/0015564 A1    Jan. 17, 2013

(30) Foreign Application Priority Data

Jul. 14, 2011   (JP) .................................. 2011-155409

(51) Int. Cl.
*H01L 23/552*   (2006.01)
*H01L 21/56*    (2006.01)
(Continued)

(52) U.S. Cl.
CPC ............ *H01L 23/552* (2013.01); *H01L 21/561* (2013.01); *H01L 24/97* (2013.01); *H01Q 1/2283* (2013.01); *H01Q 9/0407* (2013.01); *H01L 21/76898* (2013.01); *H01L 24/05* (2013.01); *H01L 24/16* (2013.01); *H01L 24/73* (2013.01); *H01L 24/81* (2013.01); *H01L 24/92* (2013.01); *H01L 2223/6677* (2013.01); *H01L 2224/04026* (2013.01); *H01L 2224/0557* (2013.01); *H01L 2224/16227* (2013.01); *H01L 2224/73204* (2013.01); *H01L 2224/73253* (2013.01); *H01L 2224/81815* (2013.01); *H01L 2224/92125* (2013.01); *H01L 2224/97* (2013.01);

(Continued)

(58) Field of Classification Search
USPC ........................................................ 257/660
See application file for complete search history.

(56) References Cited

U.S. PATENT DOCUMENTS 5,687,062 A * 11/1997 Larson ........................... 361/706
7,049,682 B1 * 5/2006 Mathews et al. ............... 257/660
(Continued)

FOREIGN PATENT DOCUMENTS

CN    1591861 A    3/2005
CN    1906807 A    1/2007
(Continued)

OTHER PUBLICATIONS

Orfanidis, Sophocles J. "Electromagnetic Waves and Antennas: Waveguides", Department of Electrical and Computer Engineering, Rutgers University. 1996 www.ece.rutgers.edu/~orfanidi/ewa.*
(Continued)

*Primary Examiner* — Lex Malsawma
*Assistant Examiner* — Laura Dykes
(74) *Attorney, Agent, or Firm* — Westerman, Hattori, Daniels & Adrian, LLP

(57) ABSTRACT

A semiconductor device (semiconductor module) includes a circuit board (module board) and a semiconductor element mounted on the circuit board. A shielding layer that blocks electromagnetic waves is disposed on the upper surface of the semiconductor element, and an antenna element is disposed over the shielding layer. The semiconductor element and the antenna element are electrically connected to each other by a connecting portion. This structure enables the semiconductor device to be reduced in size and to have both an electromagnetic-wave blocking function and an antenna function.

12 Claims, 21 Drawing Sheets

(51) Int. Cl.
*H01L 23/00* (2006.01)
*H01Q 1/22* (2006.01)
*H01Q 9/04* (2006.01)
*H01L 21/768* (2006.01)

(52) U.S. Cl.
CPC ............... *H01L2924/15311* (2013.01); *H01L 2924/16152* (2013.01); *H01L 2924/167* (2013.01); *H01L 2924/19041* (2013.01); *H01L 2924/19042* (2013.01); *H01L 2924/19043* (2013.01); *H01L 2924/19105* (2013.01); *H01L 2924/01029* (2013.01); *H01L 2224/16225* (2013.01)
USPC .......................................... 257/660; 438/121

(56) References Cited

U.S. PATENT DOCUMENTS

| | | |
|---|---|---|
| 2001/0052645 A1 | 12/2001 | Op'T Eynde et al. |
| 2002/0050632 A1* | 5/2002 | Tuttle .............................. 257/678 |
| 2002/0167060 A1 | 11/2002 | Buijsman et al. |
| 2003/0132430 A1* | 7/2003 | Tsai ................................. 257/2 |
| 2005/0045369 A1 | 3/2005 | Ishimaru et al. |
| 2006/0043539 A1* | 3/2006 | Thomas et al. ................ 257/659 |
| 2006/0097404 A1* | 5/2006 | Cho et al. ....................... 257/782 |
| 2006/0176220 A1* | 8/2006 | Tamaoka .................... 343/7 MS |
| 2006/0267202 A1 | 11/2006 | Matsuzaki |
| 2007/0200748 A1* | 8/2007 | Hoegerl et al. ................. 342/85 |
| 2009/0168367 A1 | 7/2009 | Fujii |
| 2009/0267221 A1 | 10/2009 | Fujii |
| 2009/0289343 A1* | 11/2009 | Chiu et al. ..................... 257/690 |
| 2009/0302481 A1 | 12/2009 | Matsuzaki |

FOREIGN PATENT DOCUMENTS

| | | |
|---|---|---|
| JP | 2001-292026 A | 10/2001 |
| JP | 2004-519916 A | 7/2004 |
| JP | 2006-287374 A | 10/2006 |
| JP | 2007-005782 A | 1/2007 |
| JP | 2007-129304 A | 5/2007 |
| JP | 2009-158742 A | 7/2009 |
| JP | 2009-266979 A | 11/2009 |
| JP | 4379004 B2 | 12/2009 |

OTHER PUBLICATIONS

Chinese Office Action dated Jul. 30, 2014, issue in corresponding Chinese Application No. 201210239365.0; W/English Translation (19 pages).
Japanese Office Action dated Oct. 14, 2014, issued in corresponding JP application No. 2011-155409 with English partial translation (3 pages).

* cited by examiner

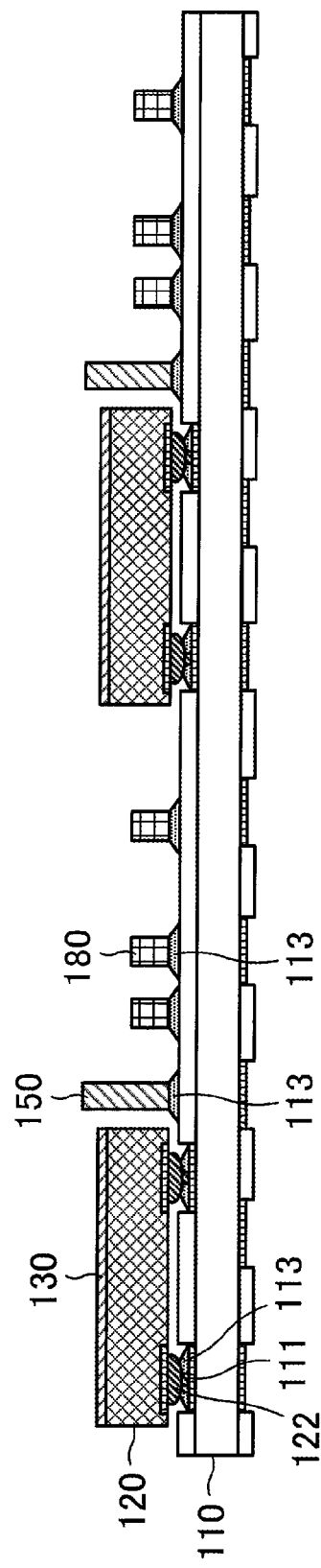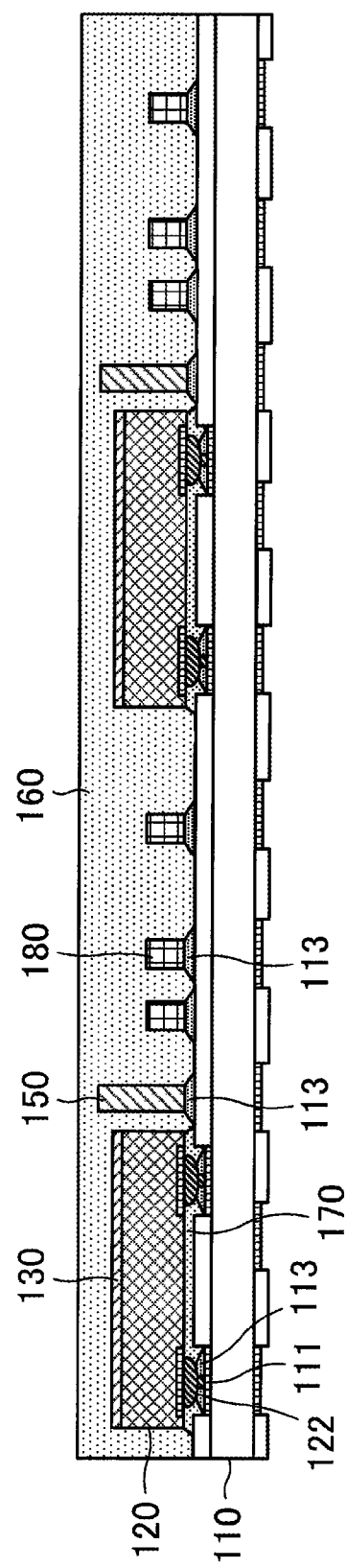

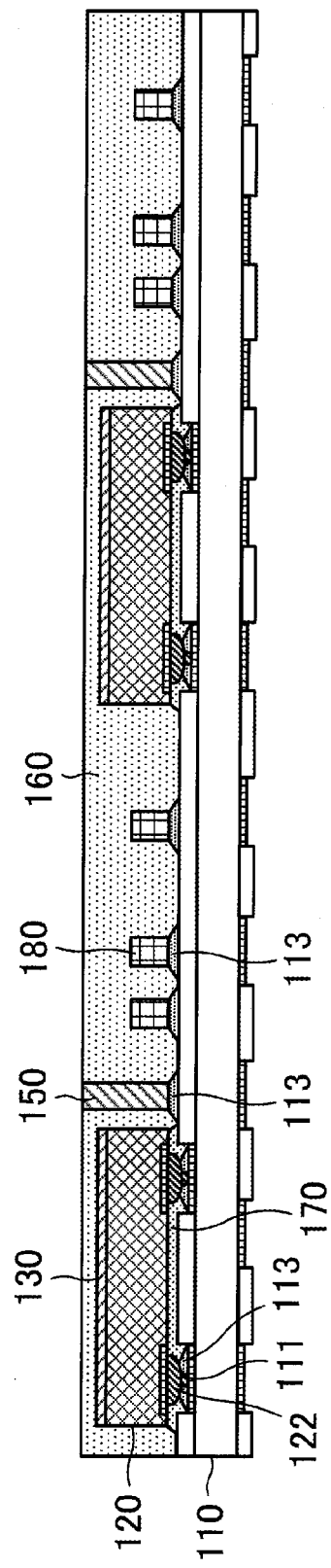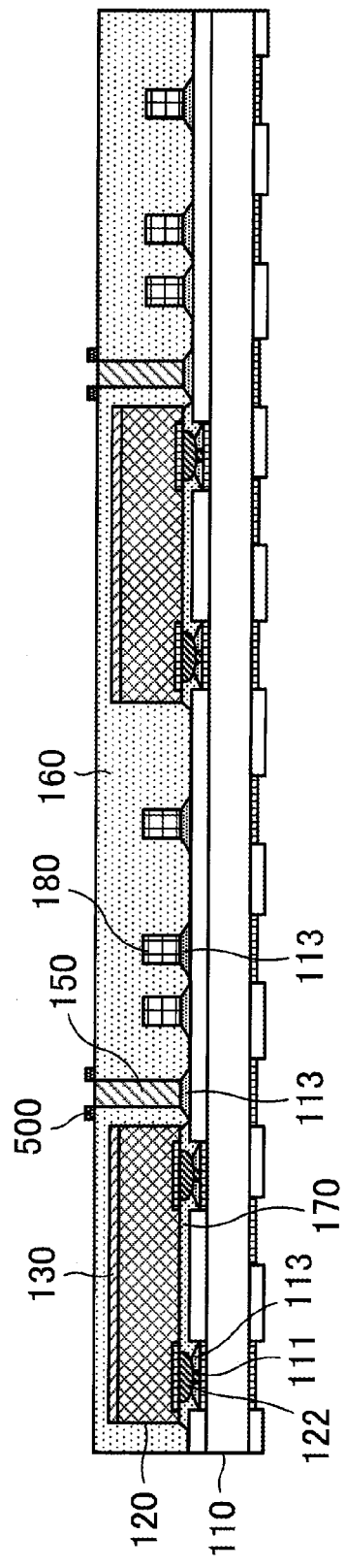

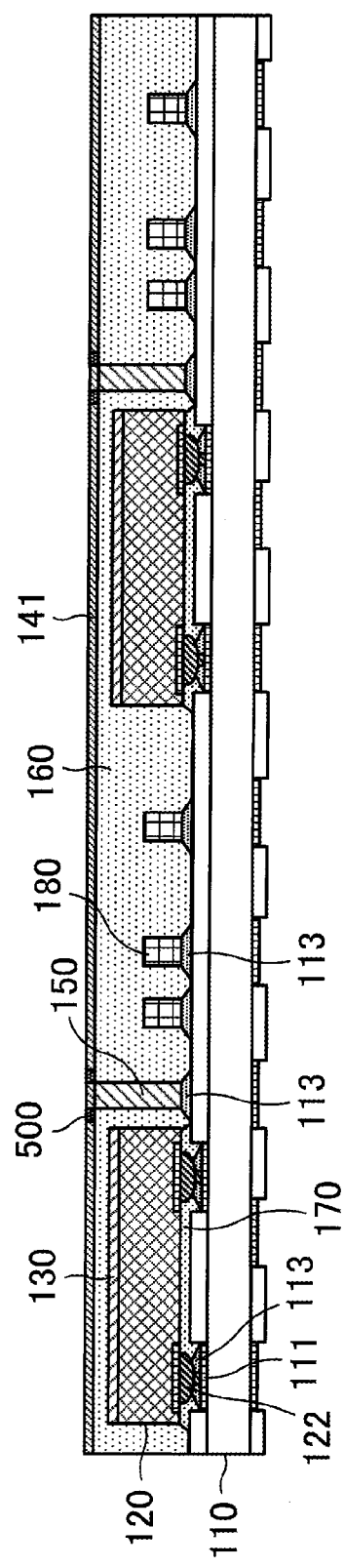

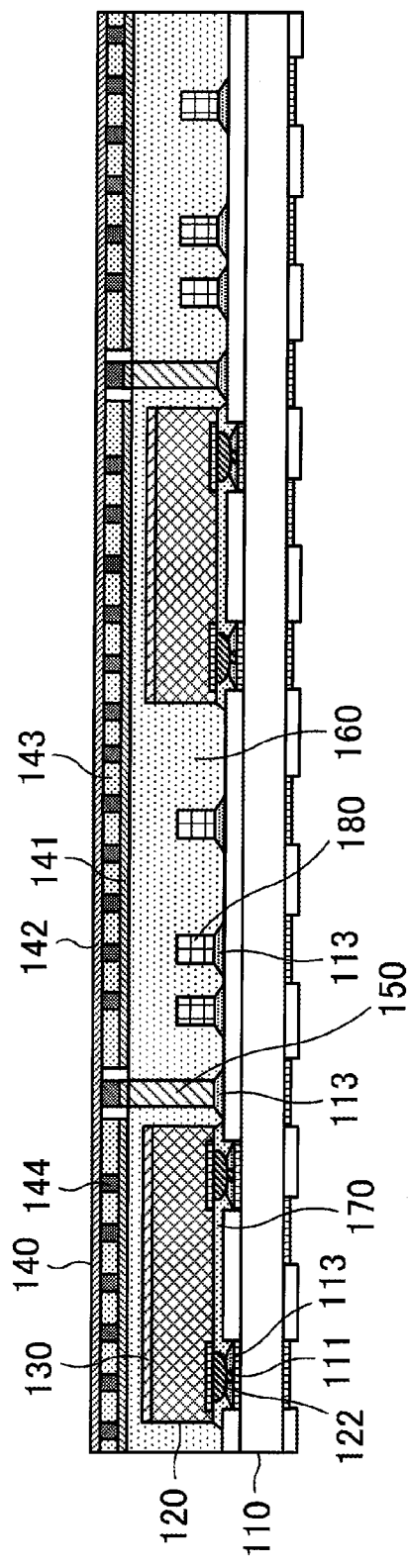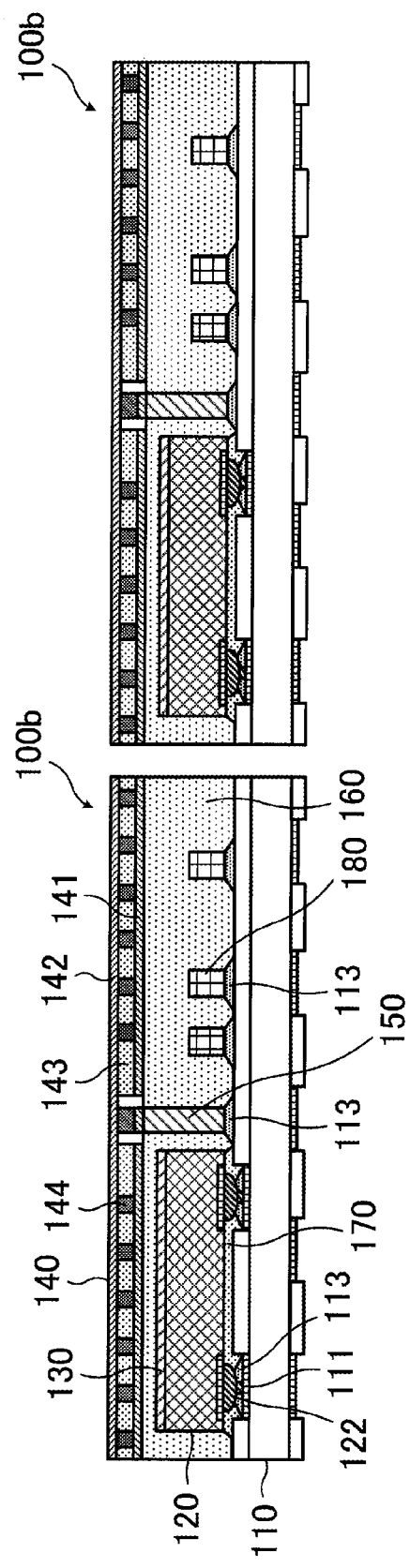

SEMICONDUCTOR DEVICE HAVING ANTENNA ELEMENT AND METHOD OF MANUFACTURING SAME

CROSS-REFERENCE TO RELATED APPLICATION

This application is based upon and claims the benefit of priority of the prior Japanese Patent Application No. 2011-155409, filed on Jul. 14, 2011, the entire contents of which are incorporated herein by reference.

FIELD

The embodiments discussed herein are related to semiconductor devices and methods of manufacturing the same.

BACKGROUND

Some technologies are known to provide semiconductor devices with a shielding function or an antenna function. Examples of such technologies include shielding semiconductor elements and other components mounted on circuit boards from electromagnetic waves, providing antennas for circuit boards on which semiconductor elements and other components are mounted, covering semiconductor elements and other components mounted on circuit boards with shields and then covering the structures with antennas, providing antennas for first surfaces of circuit boards, the first surfaces being on the reverse sides of second surfaces on which semiconductor elements and other components are mounted, and providing antennas for rear surfaces of packages including semiconductor elements and other components. In addition, forming conductive layers to surround signal wiring layers in view of propagation characteristics of signals transmitted from and received by antennas is also a known technology (see, for example, Japanese Patent No. 4,379,004, Japanese National Publication of International Patent Application No. 2004-519916, and Japanese Laid-open Patent Publication Nos. 2009-158742, 2001-292026, and 2007-005782)

For example, a module (a semiconductor device including semiconductor elements) provided with a shielding part functioning as a shield and an antenna part functioning as an antenna may be mounted on a circuit board such as a motherboard to constitute a device. In this case, however, the size of the device may be increased. The shielding part and the antenna part may be integrated together to constitute the module. In this case, however, processing of components or electrical connection during assembling of the module may become complicated, and the module may fail to achieve desired properties and reliability.

SUMMARY

According to one aspect of the invention, a semiconductor device includes a circuit board, a semiconductor element mounted on the circuit board, a shielding layer disposed on the upper surface of the semiconductor element, an antenna element disposed over the shielding layer, and a connecting portion passing through the shielding layer and electrically connecting the semiconductor element and the antenna element.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 13A and 13B illustrate the example method of forming the semiconductor module according to the second embodiment;

FIGS. 14A and 14B illustrate the example method of forming the semiconductor module according to the second embodiment;

FIGS. 15A and 15B illustrate the example method of forming the semiconductor module according to the second embodiment;

FIGS. 16A and 16B illustrate the example method of forming the semiconductor module according to the second embodiment;

DESCRIPTION OF EMBODIMENTS

Figure 1:
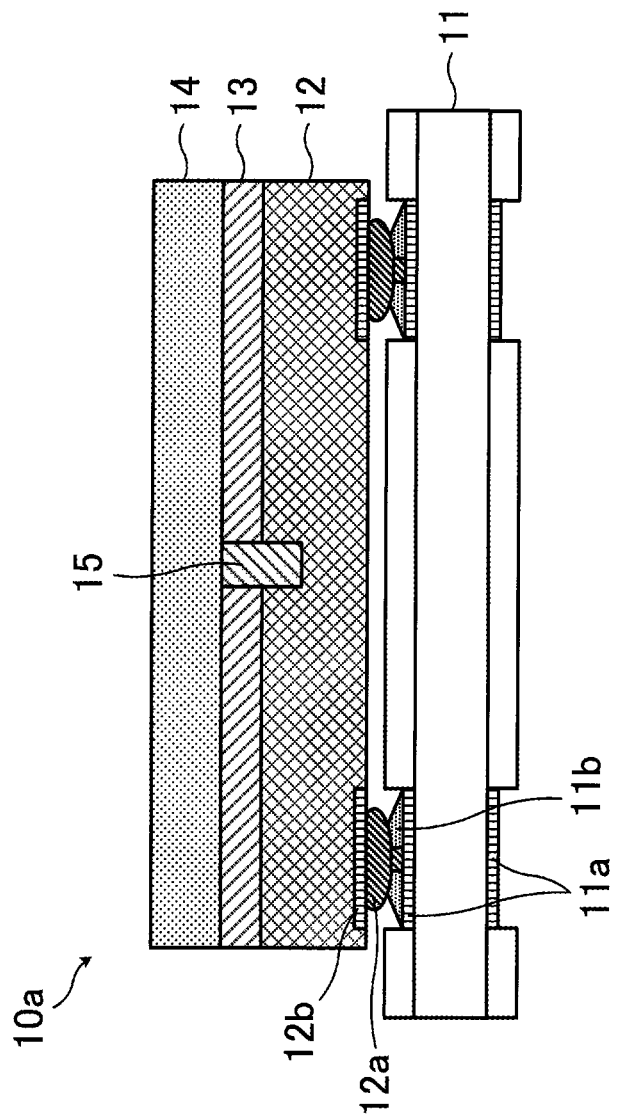
FIG. 1 illustrates a first example structure of a semiconductor device.

FIG. 1 illustrates a first example structure of a semiconductor device. FIG. 1 is a schematic cross-section of the semiconductor device having the first example structure.

A semiconductor device (semiconductor module) 10a illustrated in FIG. 1 includes a circuit board (module board) 11, a semiconductor element 12, a shielding layer 13, an antenna element 14, and a connecting portion 15.

Although not illustrated, the module board 11 has predetermined circuits inside thereof. The circuits are formed of conductive portions such as wiring lines and vias. The module board 11 also has electrode pads 11a disposed on the top and bottom surfaces thereof. The semiconductor element 12 is mounted on this module board 11. In this example, bumps 12a and electrode pads 12b are disposed on the lower surface of the semiconductor element (circuit surface having wiring layers and the like formed thereon) so as to correspond to the electrode pads 11a of the module board 11, and the semiconductor element is flip-chip mounted on the module board 11 with the bumps 12a, the electrode pads 12b, and joining portions 11b interposed therebetween.

The shielding layer 13 is formed on at least the upper surface (surface of a semiconductor substrate) of the semiconductor element 12 mounted on the module board 11 as described above. The shielding layer 13 blocks electromagnetic waves propagating toward the semiconductor element 12, or blocks electromagnetic waves generated at the semiconductor element 12 from being emitted to the outside. The shielding layer 13 is composed of a material capable of blocking electromagnetic waves, for example, a magnetic material or a metal material. The shielding layer 13 may be, for example, a layer (sheet) composed of resin in which magnetic particles are dispersed, a magnetic layer composed of a magnetic material, or a metal layer composed of a metal material such as copper (Cu). In addition, the shielding layer 13 may partially include a sheet composed of resin in which magnetic particles are dispersed, a magnetic layer, or a metal layer. In cases where a metal layer is used as a part of the shielding layer 13, it is desirable that the metal layer be disposed on, for example, the outermost surface of the shielding layer 13.

The antenna element 14 is disposed on the shielding layer 13. The antenna element 14 has a function of an antenna that receives electromagnetic waves from the outside. The antenna element 14 includes at least one antenna layer having, for example, a predetermined waveguide pattern (waveguide) formed therein to receive electromagnetic waves. The antenna layer may be composed of Cu or a metal material mainly composed of Cu. The antenna layer may be formed on, for example, the top surface or the top and bottom surfaces of a dielectric layer composed of resin or the like. The antenna layers formed on the top and bottom surfaces may be electrically connected by conductive portions that pass through the dielectric layer interposed between the antenna layers.

The antenna element 14 is electrically connected to the semiconductor element 12 by the connecting portion 15. In this example, the connecting portion 15 passes through the shielding layer 13 so as to reach the inside of the semiconductor element 12, and the antenna element 14 is disposed on the shielding layer 13 so as to be electrically connected to the connecting portion 15. This enables the semiconductor element 12 and the antenna element 14 to be electrically interconnected.

In this case, the connecting portion 15 serves as a through-silicon via (TSV) that passes through, for example, the shielding layer 13 and the semiconductor substrate of the semiconductor element 12 and that is connected to conductive portions inside an wiring layer formed on the semiconductor substrate (herein adjacent to the module board 11).

In this manner, the semiconductor element 12 mounted on the module board 11 and the antenna element 14 are electrically interconnected by the connecting portion 15 that passes through the shielding layer 13 formed on the upper surface of the semiconductor element 12 in the semiconductor module 10a illustrated in FIG. 1. Electrical signals, for example, currents, derived from predetermined electromagnetic waves received by the antenna element 14 are supplied to the semiconductor element 12 through the connecting portion 15. The shielding layer 13 blocks electromagnetic waves received by the antenna element 14 from being incident on the semiconductor element 12, or electromagnetic waves generated at the semiconductor element 12 from being emitted. The antenna element 14 receives power from the module board 11 through the semiconductor element 12 and the connecting portion 15 during signal transmission.

In this manner, the shielding layer 13 formed on the semiconductor element 12 and the antenna element 14 disposed on the shielding layer 13 enable the semiconductor module 10a to have a module structure with both a shielding function and an antenna function. This leads to a reduction in the size of the module compared with the case where, for example, a module having a shielding function is provided with an additional antenna part outside thereof.

Although the shielding layer 13 is formed on only the upper surface of the semiconductor element 12 in this case, the shielding layer 13 may also be formed on side surfaces of the semiconductor element 12. For example, the shielding layer 13 may be formed on the upper surface and the side surfaces of the semiconductor element when the semiconductor element 12 has a relatively large thickness or when incidence of electromagnetic waves from the outside on the side surfaces of the semiconductor element 12 or emission of electromagnetic waves from the side surfaces of the semiconductor element 12 is not to be overlooked.

The position of the connecting portion 15 illustrated in FIG. 1 is an example, and may be set in accordance with the structure of the semiconductor element 12 and that of the antenna element 14 as appropriate. For example, the connecting portion 15 may be formed at an outer end portion of the semiconductor element 12. In addition, the connecting portion 15 may be formed outside the semiconductor element 12 as illustrated in FIG. 2.

Figure 2:
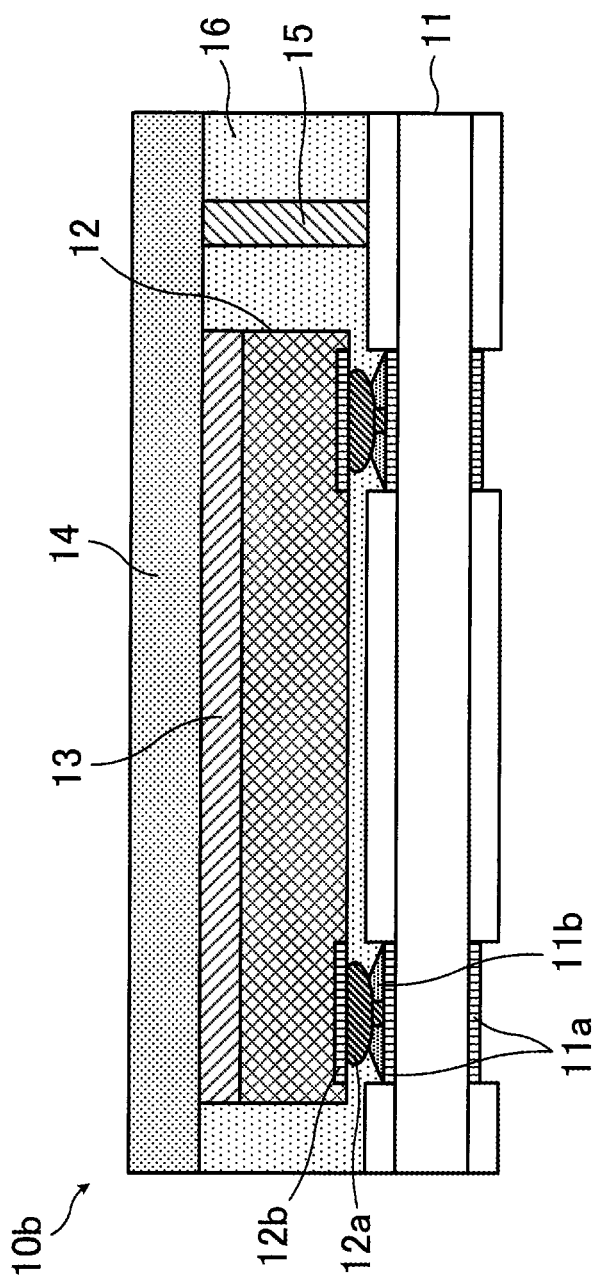
FIG. 2 illustrates a second example structure of the semiconductor device.

FIG. 2 illustrates a second example structure of a semiconductor device. FIG. 2 is a schematic cross-section of the semiconductor device having the second example structure.

A semiconductor device (semiconductor module) 10b illustrated in FIG. 2 includes a module board 11, a semiconductor element 12 mounted thereon, a shielding layer 13 formed on the upper surface of the semiconductor element 12, an antenna element 14 disposed on the shielding layer 13, and a connecting portion 15. The module board 11 and the antenna element 14 are electrically interconnected by the connecting portion 15. The semiconductor element 12 and the connecting portion 15 disposed between the module board 11 and the antenna element 14 are sealed by a sealing resin 16.

Electrical signals derived from electromagnetic waves received by the antenna element 14 are supplied from the connecting portion 15 to the semiconductor element 12 through the module board 11. The antenna element 14 receives power from the module board 11 through the connecting portion 15 during signal transmission.

As in the case of the semiconductor module 10a, the size of the semiconductor module 10b having the above-described structure may also be reduced compared with the case where, for example, an antenna part is added outside the module.

Semiconductor modules will now be described in more detail.

First, a first embodiment will be described.

Figure 3:
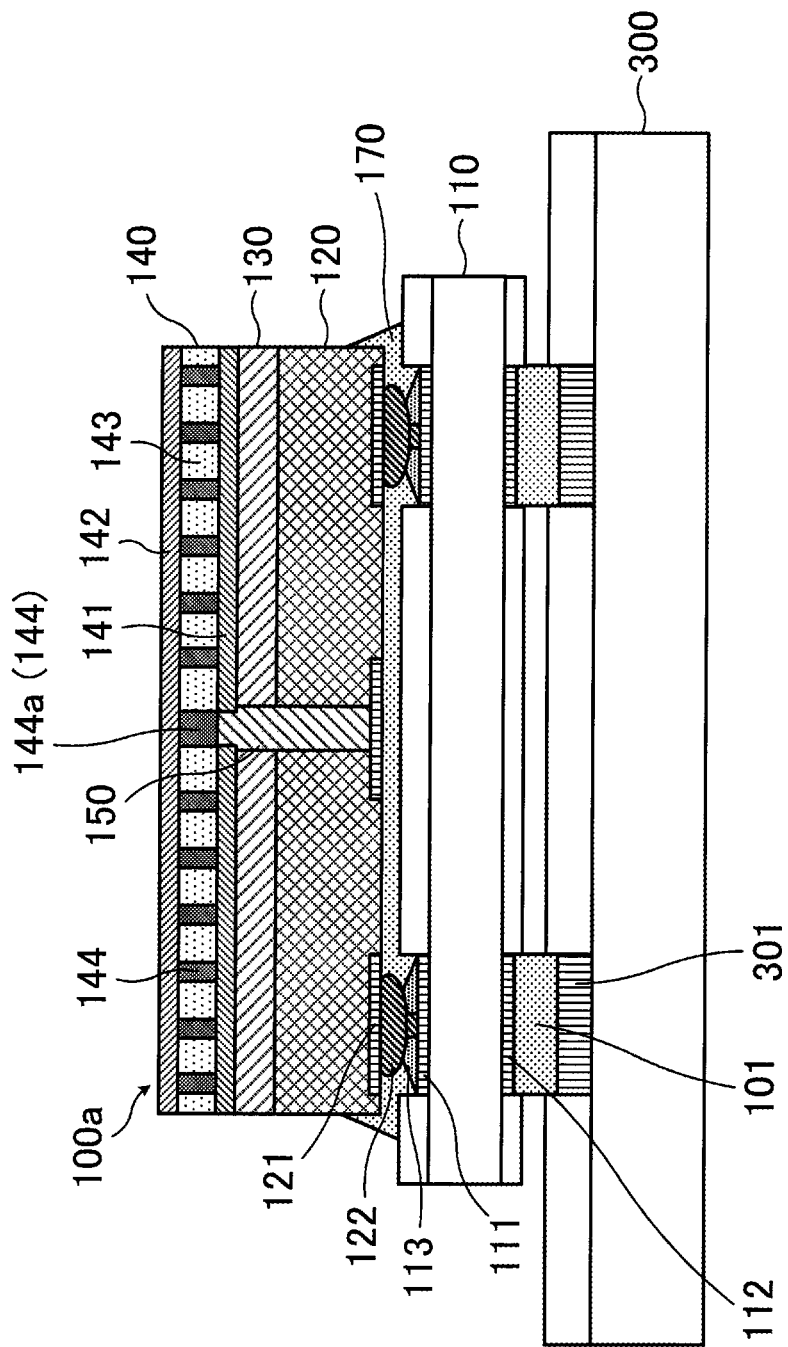
FIG. 3 illustrates an example semiconductor module according to a first embodiment.

FIG. 3 illustrates an example semiconductor module according to the first embodiment. FIG. 3 is a schematic cross-section of the semiconductor module according to the first embodiment.

A semiconductor module (semiconductor device) 100a illustrated in FIG. 3 includes a module board (circuit board) 110, a semiconductor element 120, a shielding layer 130, an antenna element 140, and a connecting portion 150.

Although not illustrated, the module board 110 in the semiconductor module 100a has predetermined circuits inside thereof. The circuits are formed of conductive portions such as wiring lines and vias. The module board 110 also has electrode pads 111 and 112 serving as terminals for external connection disposed on the top and bottom surfaces thereof.

The semiconductor element 120 is mounted on one of the surfaces of the module board 110. Electrode pads 121 and bumps 122 are disposed on the lower surface of the semiconductor element 120 (circuit surface having wiring layers and the like formed thereon) so as to correspond to the electrode pads 111 of the module board 110, and the semiconductor element 120 is flip-chip mounted on the module board 111 with the electrode pads 121, the bumps 122, and joining portions 113 interposed therebetween. An underfill resin 170 fills the space between the semiconductor element 120 and the module board 110.

The shielding layer 130 is composed of, for example, resin containing magnetic particles, and has a sheet-like shape. The shielding layer 130 is formed on the upper surface (surface of a semiconductor substrate) of the semiconductor element 120. The shielding layer 130 may also be formed on side surfaces of the semiconductor element 120 in accordance with the form of the semiconductor element 120.

The antenna element 140 is disposed on the shielding layer 130. The antenna element 140 includes a first antenna layer 141, a second antenna layer 142, a dielectric layer 143, and conductive portions (vias) 144.

The first antenna layer 141 is formed on the shielding layer 130, and the second antenna layer 142 is formed over the first antenna layer 141 with the dielectric layer 143 interposed therebetween. The first antenna layer 141 and the second antenna layer 142 are composed of Cu or a metal material mainly composed of Cu. The first antenna layer 141 and the second antenna layer 142 are electrically interconnected by the conductive portions 144. The conductive portions 144 are composed of Cu, solder, or the like, and pass through the dielectric layer 143.

For example, the first antenna layer 141 is not patterned, and the second antenna layer 142 has a predetermined waveguide pattern that propagates received electromagnetic waves. The waveguide pattern of the second antenna layer 142 will be described below.

The antenna element 140 is electrically connected to the semiconductor element 120 by the connecting portion 150. The connecting portion 150 may be a TSV. This connecting portion 150 passes through the first antenna layer 141 of the antenna element 140 and the shielding layer 130 thereunder so as to reach inside the semiconductor element 120. The connecting portion 150 is connected to a predetermined portion of the semiconductor element 120. In this example, the connecting portion 150 is connected to one of the electrode pads 121 linked to wiring lines (not illustrated). The upper end of the connecting portion 150 is connected to a conductive portion 144a (144) of the antenna element 140.

The semiconductor module 100a having the above-described structure is electrically connected to electrode pads 301 of a motherboard 300 by bumps 101 composed of solder or the like, and thereby mounted on the motherboard 300.

As described above, a predetermined waveguide pattern is formed in the second antenna layer 142 of the antenna element 140 in the semiconductor module 100a.

Figure 4A:
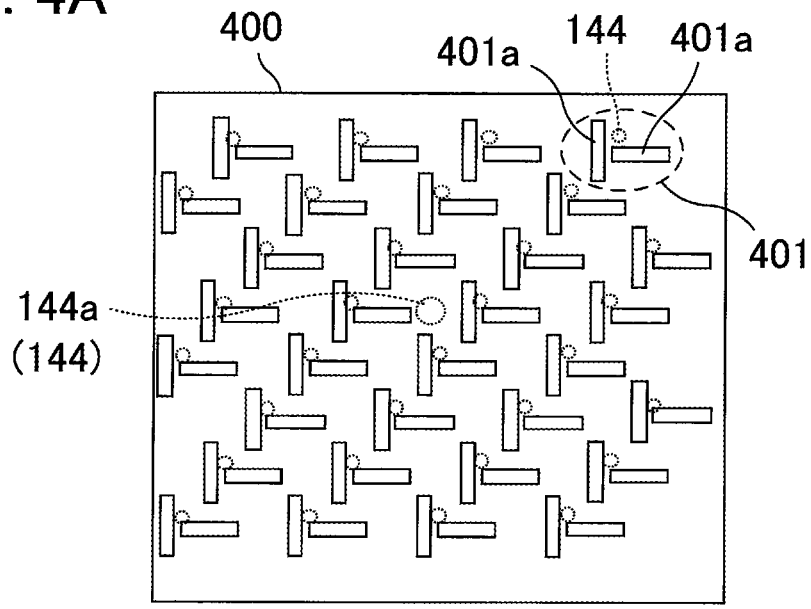
FIGS. 4A and 4B illustrate example waveguide patterns formed in an antenna layer.
Figure 4B:
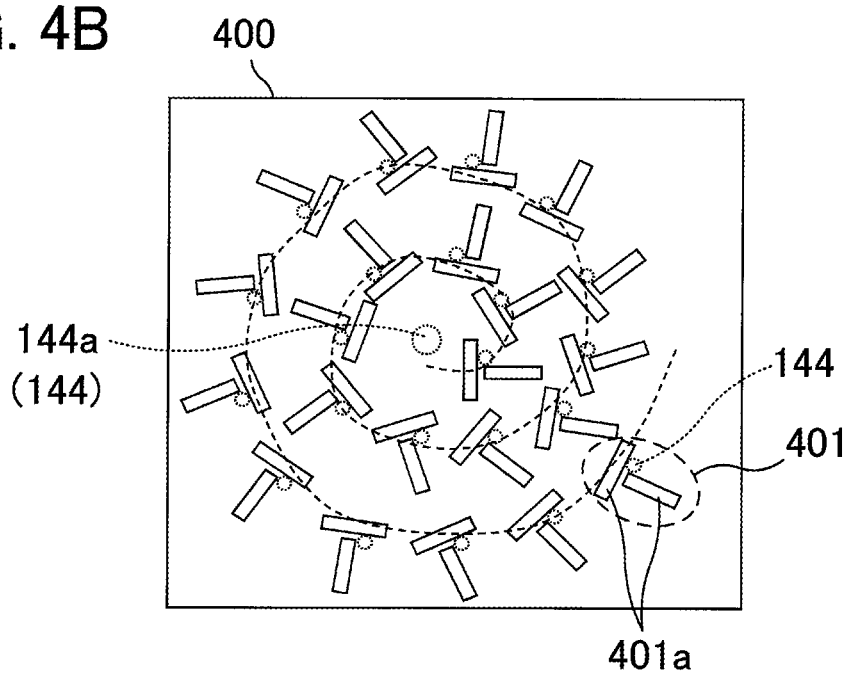

FIGS. 4A and 4B illustrate example waveguide patterns formed in the antenna layer. FIGS. 4A and 4B are example schematic plan views of the antenna layer.

The waveguide patterns formed in antenna layers 400 illustrated in FIGS. 4A and 4B include slot pairs 401 each formed of a pair of rectangular slots (openings; through-holes) 401a laid out such that the longitudinal directions thereof intersect with each other. FIG. 4A illustrates a waveguide pattern of a so-called multiple slot-pair antenna. The waveguide pattern includes a plurality of slot pairs 401 arranged in parallel. FIG. 4B illustrates a waveguide pattern of a so-called radial-line slot-pair antenna. The waveguide pattern includes a plurality of slot pairs 401 arranged in a spiral (indicated by a dotted line).

The plane size and the layout of each slot 401a in the slot pairs 401 and the layout of the plurality of slot pairs 401 are designed on the basis of, for example, the frequency (wavelength) of electromagnetic waves to be transmitted and received by the antenna layer 400. The antenna layer 400 exchanges electrical signals through the conductive portions 144 disposed adjacent to the slot pairs 401 or through the conductive portion 144a (144) in a central area during signal transmission and reception.

The second antenna layer 142 of the antenna element 140 in the semiconductor module 100a may have a waveguide pattern similar to those formed in the antenna layers 400 illustrated in FIGS. 4A and 4B.

Figure 5A:
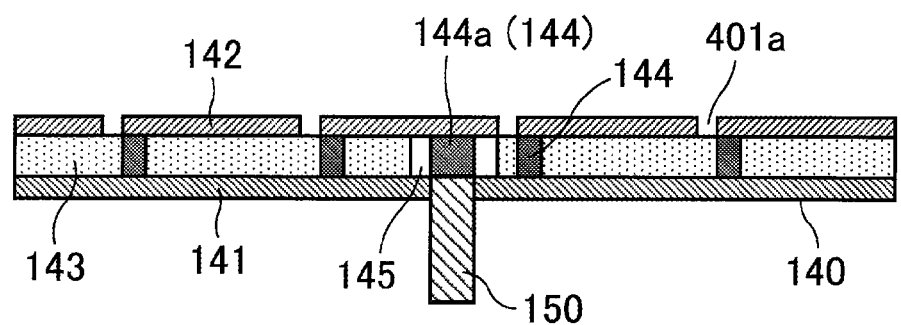
FIGS. 5A to 5C illustrate an antenna element and a connecting portion.
Figure 5B:
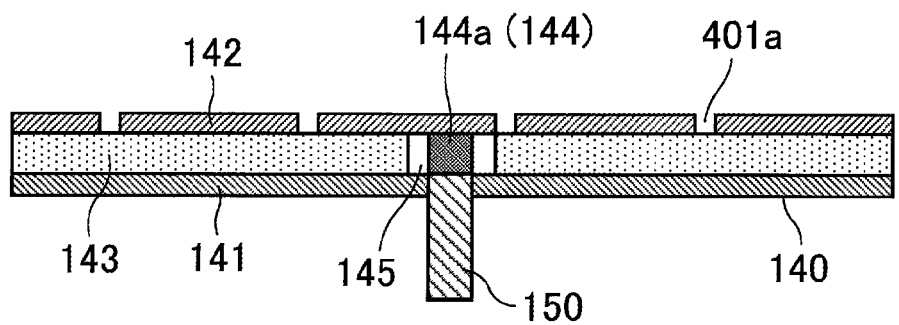
Figure 5C:
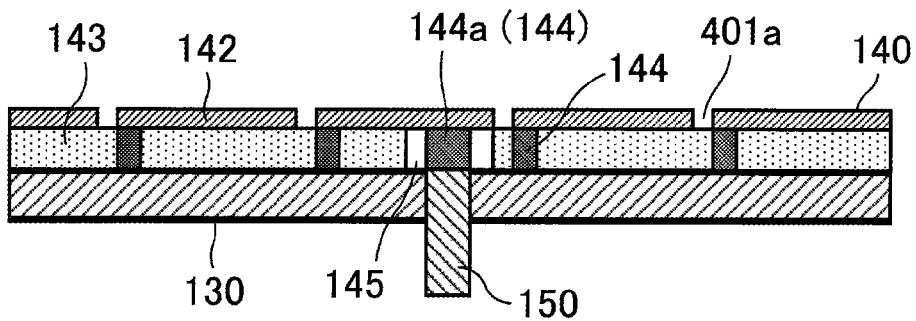

FIGS. 5A to 5C illustrate the antenna element and the connecting portion. FIGS. 5A to 5C are schematic cross-sections of the antenna element and the connecting portion.

FIG. 5A illustrates the antenna element 140 including the first antenna layer 141 that is not patterned and the second antenna layer 142 that has a waveguide pattern including slots 401a (slot pairs 401) formed therein. The first antenna layer 141 and the second antenna layer 142 are electrically interconnected by the conductive portions 144 formed at positions corresponding to those of the slot pairs 401. The conductive portion 144a (144) located at the central portion is electrically connected to the connecting portion 150.

As illustrated in FIGS. 5A to 5C, a hollow portion 145 may be left around the periphery of the conductive portion 144a that is electrically connected to the connecting portion 150 at the central portion.

A structure such as an insulating film for insulating the connecting portion 150 from the first antenna layer 141 or a structure for separating the edge of the first antenna layer 141 from the side surface of the connecting portion 150 may be provided between the connecting portion 150 and the first antenna layer 141.

As illustrated in FIG. 5B, the antenna element does not need to include the conductive portions 144 (except for the conductive portion 144a connected to the connecting portion 150) between the first antenna layer 141 and the second antenna layer 142, and the first antenna layer 141 and the second antenna layer 142 may be capacitively coupled to each other to constitute the antenna element.

As illustrated in FIG. 5C, the antenna element does not need to include the first antenna layer 141 in cases where the shielding layer 130 is a metal layer partially (outermost surface) or entirely composed of, for example, Cu. In this case, the shielding layer 130, the dielectric layer 143 including the conductive portions 144, and the second antenna layer 142 constitute the antenna element. That is, the shielding layer 130 functions as a part of the antenna element instead of the first antenna layer 141. The antenna element does not need to include the conductive portions 144 (except for the conductive portion 144a) also in this case.

In the semiconductor module 100a, electrical signals derived from electromagnetic waves received by the antenna element 140 are supplied to the semiconductor element 120 through the connecting portion 150. The antenna element 140 receives power from the module board 110 through the semiconductor element 120 and the connecting portion 150 during signal transmission.

The semiconductor module 100a having the above-described structure is mounted on the motherboard (circuit board) 300.

In the semiconductor module 100a, the shielding layer 130 and the antenna element 140 are disposed on the semiconductor element 120 mounted on the module board 110. This structure leads to a reduction in the size of the module.

Next, an example method of forming the semiconductor module 100a according to the first embodiment will be described with reference to FIGS. 6A to 9.

Figure 6A:
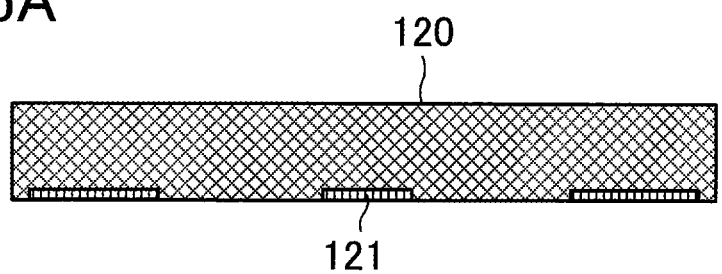
FIGS. 6A to 6D illustrate an example method of forming the semiconductor module according to the first embodiment.

First, a semiconductor element 120 as illustrated in FIG. 6A is prepared. FIG. 6A illustrates only one semiconductor element 120. However, in this preliminary stage, the semiconductor element 120 may be a wafer to be diced into a plurality of semiconductor elements 120 (hereinafter referred to as a "wafer state").

Figure 6B:
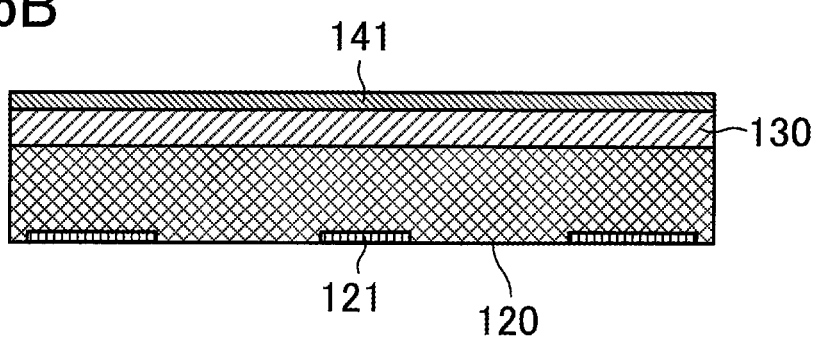

Next, as illustrated in FIG. 6B, a shielding layer 130 is formed on the upper surface (a surface of a semiconductor substrate) of the semiconductor element 120 (wafer state). Subsequently, a first antenna layer 141 is formed on the shielding layer 130. Herein, the shielding layer 130 is a sheet composed of resin in which magnetic particles (magnetic metal powder) are dispersed. Such a sheet produced in advance is bonded to the upper surface of the semiconductor element 120 while the resin is semicured. Alternatively, resin composite paste including resin in which magnetic particles are dispersed is applied to the upper surface of the semiconductor element 120. The sheet or the paste is then cured to form the shielding layer 130. The first antenna layer 141 is formed on the shielding layer 130 using Cu or the like by electroless plating or vapor deposition.

Figure 6C:
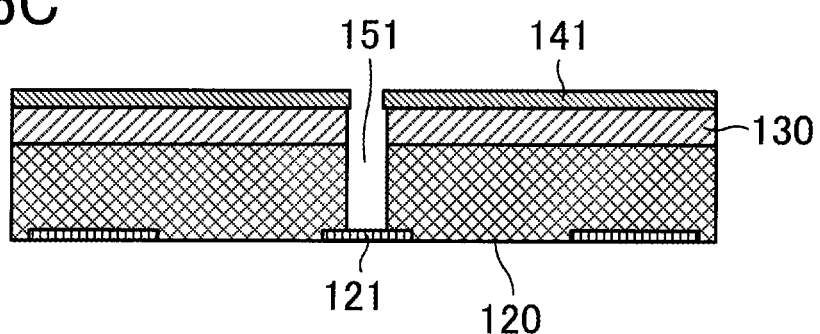

Next, as illustrated in FIG. 6C, an opening 151 is formed by laser irradiation at a position where a connecting portion 150 is to be formed. The opening 151 passes through the first antenna layer 141 and the shielding layer 130, and reaches inside the semiconductor element 120. In this example, the opening 151 formed by laser irradiation reaches one of electrode pads 121 exposed through the lower surface (circuit surface having wiring layers and the like formed thereon) of the semiconductor element 120.

Figure 9:
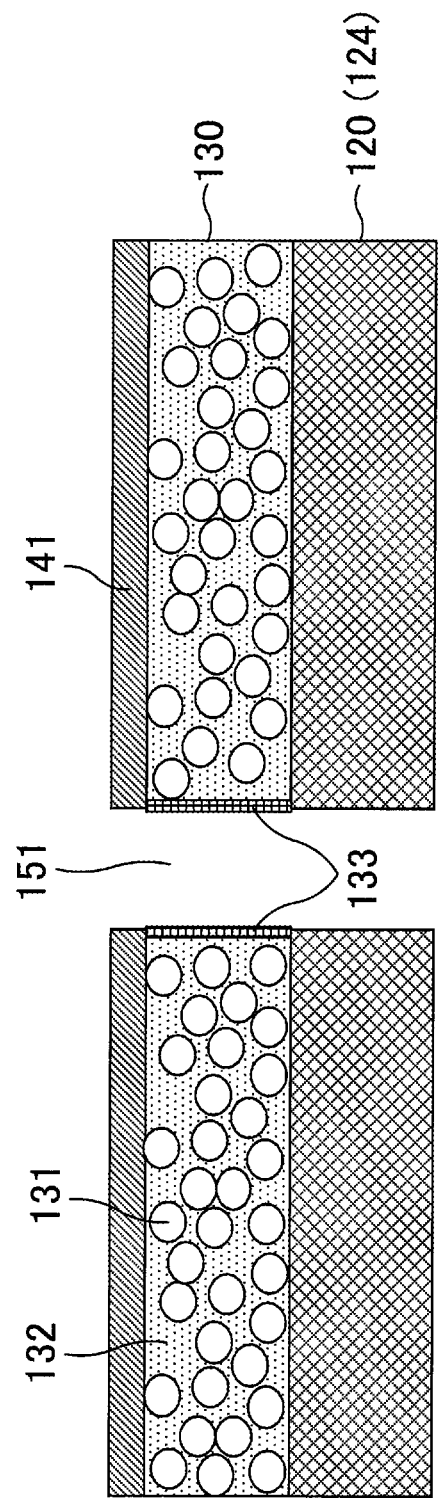
FIG. 9 illustrates the example method of forming the semiconductor module according to the first embodiment.

This laser irradiation causes a sidewall portion of the opening 151 in the shielding layer 130 to be carbonized, resulting in a carbide layer 133 as illustrated in, for example, FIG. 9. Herein, the shielding layer 130 is composed of resin 132 in which magnetic particles 131 are dispersed. The shielding layer 130 becomes conductive at the portion of this carbide layer 133 whereas the shielding layer 130 is electrically insulated or highly resistive at portions other than the carbide layer 133. In addition, this laser irradiation causes a sidewall portion of the opening 151 in the semiconductor element 120 (semiconductor substrate 124) to be oxidized, resulting in an oxide layer (not illustrated). For example, a silicon oxide (SiO) layer is formed in cases where the semiconductor substrate 124 is a silicon (Si) board. In addition, this laser irradiation may cause an oxide layer (not illustrated) to be formed at a sidewall portion of the opening 151 in the first antenna layer 141.

After the opening 151 is formed by laser irradiation, an ashing process using oxygen (O$_2$) plasma gas may be performed. This ashing process oxidizes the surface of the semiconductor substrate 124 exposed through the inner surface of the opening 151 or stabilizes the oxide layer formed during laser irradiation, and increases the insulation properties of the surface of the semiconductor substrate 124 in the opening 151. This ashing process may also cause the surface of the first antenna layer 141 (the upper surface and the inner surface of the opening 151) to be oxidized.

Figure 6D:
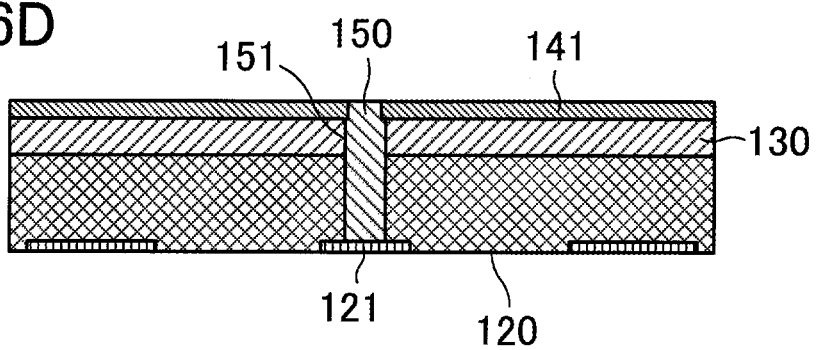

Next, as illustrated in FIG. 6D, a conductive material is applied into the opening 151 to form the connecting portion 150. For example, solder-based conductive paste is applied into the opening 151, and is reflowed to form the connecting portion 150. At this moment, the semiconductor substrate (semiconductor substrate 124 illustrated in FIG. 9) and the first antenna layer 141 are electrically insulated from the connecting portion 150 by the oxide layers formed on the semiconductor substrate and the first antenna layer 141 at the inner surface of the opening 151.

Figure 7A:
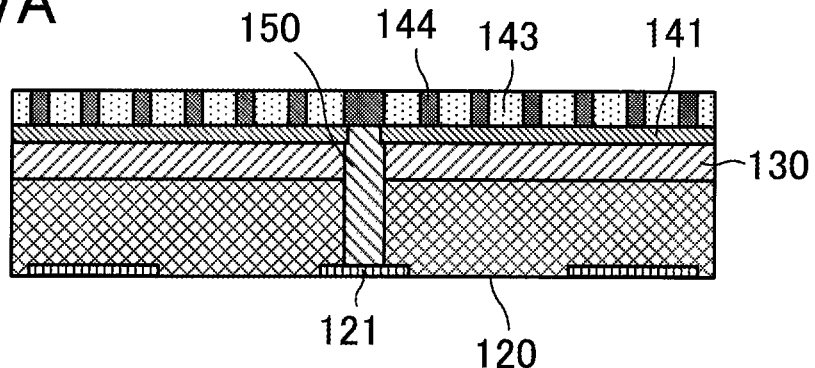
FIGS. 7A to 7C illustrate the example method of forming the semiconductor module according to the first embodiment.

Next, as illustrated in FIG. 7A, a dielectric layer 143 and conductive portions 144 are formed on the first antenna layer 141 (wafer state). For example, a sheet including the dielectric layer 143 and the conductive portions 144 passing therethrough is formed in advance, and is bonded to the first antenna layer 141.

This sheet may be formed by, for example, boring through-holes in the dielectric layer 143 composed of resin or the like by laser irradiation, and by applying solder-based conductive paste into the through-holes to form the conductive portions 144. Bonding of this sheet to the first antenna layer 141 and a reflow process enable the conductive portions 144 to be connected to the first antenna layer 141 and the connecting portion 150. In cases where the surface of the first antenna layer 141 and that of the connecting portion 150 are oxidized, the sheet may be bonded to the first antenna layer 141 after deoxidation.

Figure 7B:
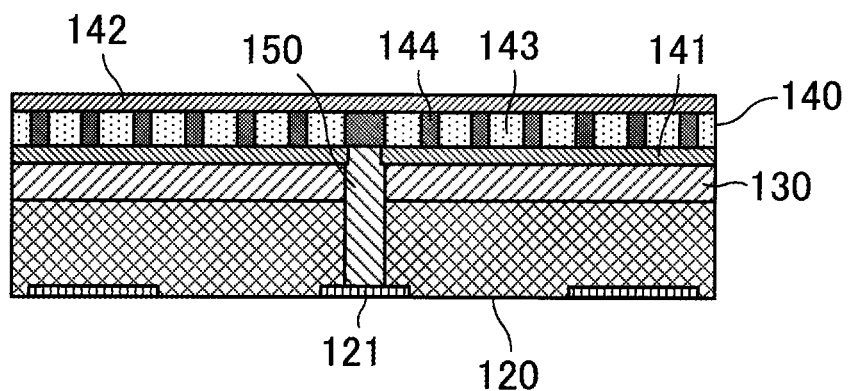

Next, as illustrated in FIG. 7B, a second antenna layer 142 having a waveguide pattern including slot pairs 401 as described above is formed on the dielectric layer 143 (wafer state) including the conductive portions 144. The second antenna layer 142 may be formed by, for example, forming a layer composed of Cu or the like on the dielectric layer 143 including the conductive portions 144 by electroless plating or vapor deposition, and by forming a predetermined waveguide pattern (openings of the slot pairs 401) in the layer by, for example, laser irradiation. Alternatively, the second antenna layer 142 may be formed using a supporting tape. In this case, a layer composed of Cu or the like is formed on the supporting tape by electroless plating or vapor deposition, a predetermined waveguide pattern is formed in the layer, and the layer is bonded onto the dielectric layer 143 including the conductive portions 144. The formation of an antenna element 140 is completed by the formation of the second antenna layer 142.

Herein, the dielectric layer 143 including the conductive portions 144 is formed on the first antenna layer 141, and subsequently the second antenna layer 142 having a predetermined waveguide pattern is formed thereon. Instead of this, a sheet including the dielectric layer 143 and the second antenna layer 142 formed thereon, the dielectric layer 143 including the conductive portions 144 and the second antenna layer 142 having a predetermined waveguide pattern formed therein, may be produced in advance, and may be bonded onto the first antenna layer 141.

Figure 7C:
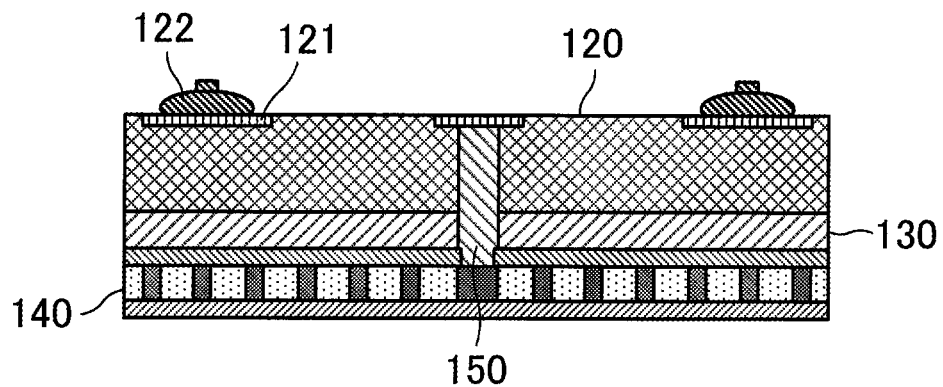

Next, as illustrated in FIG. 7C, bumps 122 are formed on the electrode pads 121 of the semiconductor element 120. Various types of bumps may be used as the bumps 122. For example, the bumps 122 may be stud bumps, ball bumps, or post electrodes. For example, the bumps 122 may be formed on the semiconductor element 120 in the wafer state, and subsequently the semiconductor element 120 may be diced into separate semiconductor elements 120. Alternatively, the bumps 122 may be formed on the separate semiconductor elements 120 after dicing.

Figure 8A:
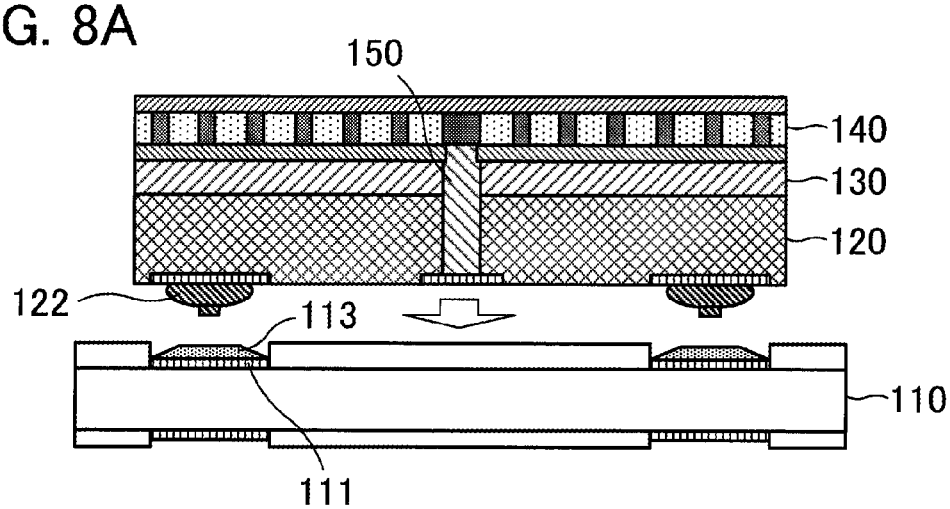
FIGS. 8A to 8C illustrate the example method of forming the semiconductor module according to the first embodiment.
Figure 8B:
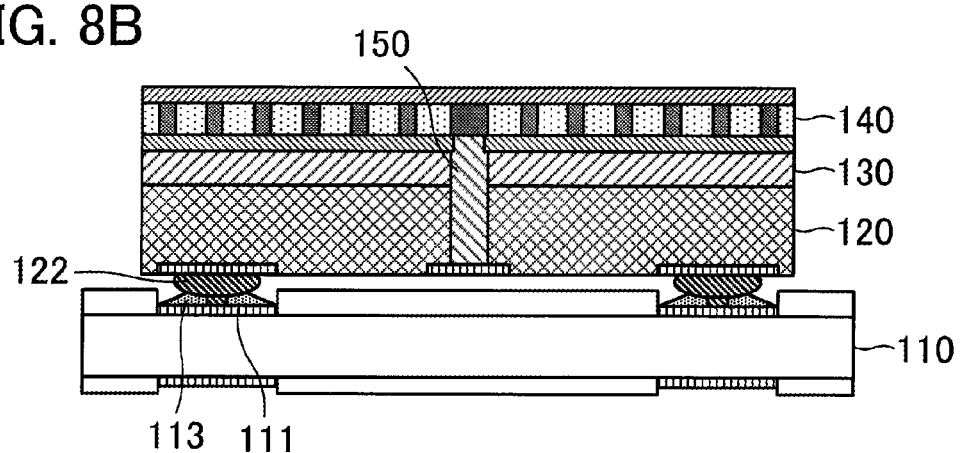
Figure 8C:
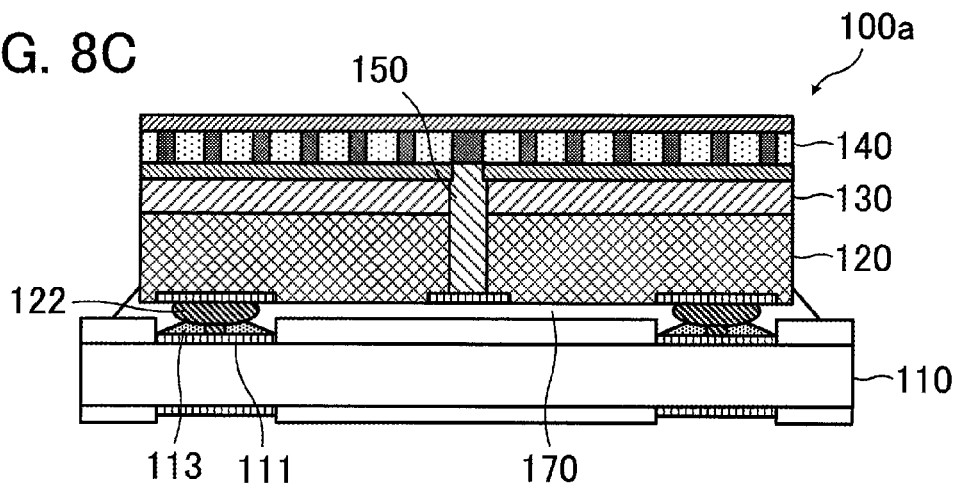

Next, as illustrated in FIG. 8A, joining portions 113 are formed on electrode pads 111 of a module board 110 using, for example, solder-based conductive paste, and the semiconductor element 120 on which the bumps 122 are formed as described above is temporarily mounted on the module board 110. Subsequently, as illustrated in FIG. 8B, a reflow process is performed so that the semiconductor element 120 is flip-chip mounted on the module board 110. Finally, as illustrated in FIG. 8C, an underfill resin 170 is applied to the space between the semiconductor element 120 and the module board 110, and is cured.

The semiconductor module 100a as illustrated in FIG. 3 is formed through the above-described steps. This semiconductor module 100a is mounted on a motherboard 300.

In the semiconductor module 100a of this example, a sheet composed of resin in which magnetic particles are dispersed is used as the shielding layer 130. The module may also be formed through a similar procedure in cases where a metal layer is partially (outermost surface) or entirely used as the shielding layer 130, that is, in cases where the shielding layer 130 functions as a part of the antenna element. That is, a metal layer or a shielding layer 130 including a metal layer is formed on the upper surface of the semiconductor element 120 by plating or vapor deposition in the step illustrated in FIG. 6B. The opening 151 is formed by laser irradiation so as to pass through the shielding layer 130 and to reach inside the semiconductor element 120 in the step illustrated in FIG. 6C. Subsequently, an asking process using $O_2$ plasma gas is performed so that the inner surface of the opening 151 (the semiconductor substrate of the semiconductor element 120 and the shielding layer 130) is electrically insulated, and the connecting portion 150 is formed by applying a conductive material. The subsequent steps may be performed similarly to those described above.

Next, a second embodiment will be described.

Figure 10:
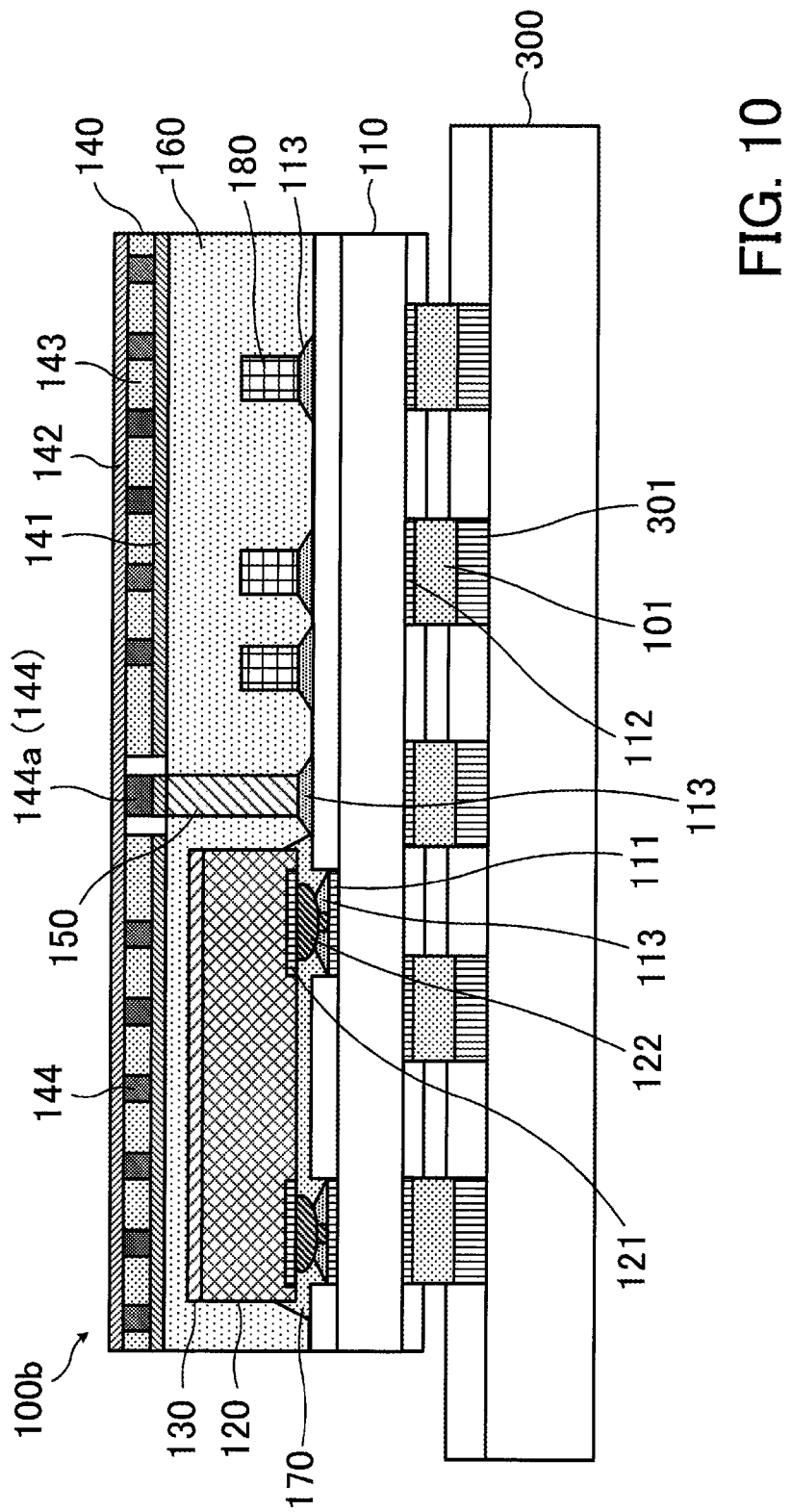
FIG. 10 illustrates an example semiconductor module according to a second embodiment.
Figure 11:
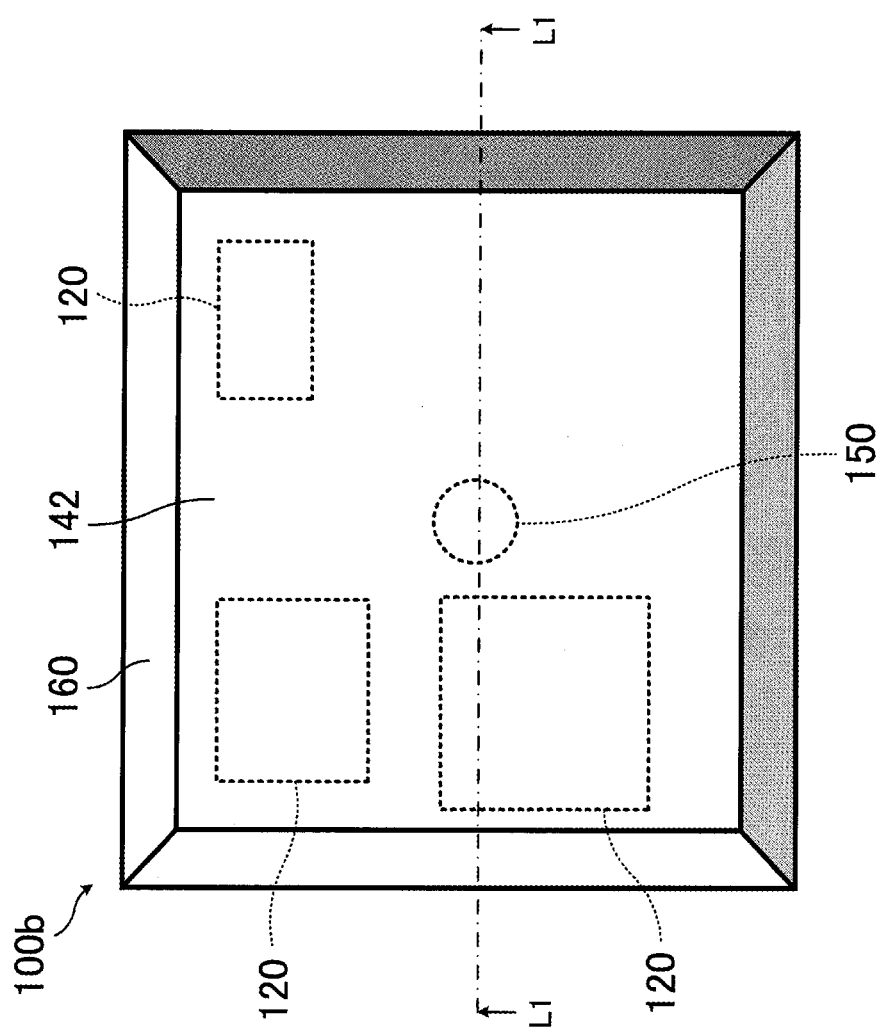
FIG. 11 illustrates the example semiconductor module according to the second embodiment.

FIGS. 10 and 11 illustrate an example semiconductor module according to the second embodiment. FIG. 10 is a schematic cross-section of the semiconductor module according to the second embodiment. FIG. 11 is a schematic top view of the example semiconductor module according to the second embodiment. Herein, FIG. 10 is a schematic cross-section taken along line L1-L1 in FIG. 11.

A semiconductor module (semiconductor device) 100b illustrated in FIG. 10 includes a module board 110, semiconductor elements 120, shielding layers 130, an antenna element 140, a connecting portion 150, and a sealing resin 160.

As illustrated in FIG. 10, the semiconductor elements 120 are flip-chip mounted on the module board 110. In addition, electronic elements 180 are mounted on the module board 110 with joining portions 113 composed of solder or the like interposed therebetween. The electronic elements 180 include, for example, passive components such as capacitors, inductors, and resistors. The connecting portion 150 is disposed on the module board 110 with one of the joining portions 113 interposed therebetween. The semiconductor elements 120 mounted on the module board 110, the shielding layers 130 formed on the semiconductor elements 120, the electronic elements 180, and the connecting portion 150 are sealed by the sealing resin 160 such that the upper end of the connecting portion 150 is exposed through the sealing resin 160. The antenna element 140 including a first antenna layer 141, a dielectric layer 143 including conductive portions 144, and a second antenna layer 142 is disposed on the sealing resin 160. The connecting portion 150 is electrically connected to the second antenna layer 142 by the first antenna layer 141 located at the upper end of the connecting portion 150 (separated from other portions of the first antenna layer 141) and a conductive portion 144a (144). The antenna element does not need to include the conductive portions 144 (except for the conductive portion 144a).

For example, as illustrated in FIG. 11, the plurality of (herein three) semiconductor elements 120 are mounted on the module board 110. The shielding layers 130 are formed on the upper surfaces (surfaces of semiconductor substrates) of the semiconductor elements 120, and may also be formed on side surfaces of the semiconductor elements 120.

The connecting portion 150 is formed in a substantially central portion of this semiconductor module 100b. The position of the connecting portion 150 is set on the basis of the layout of the semiconductor elements 120 and the electronic elements 180. In addition, the size of slots in slot pairs to be formed in the second antenna layer 142 of the antenna element 140 and the layout of the slot pairs, for example, may be set on the basis of the frequency of electromagnetic waves to be transmitted and received, the layout of the connecting portion 150, and other conditions.

In the semiconductor module 100b, electrical signals derived from electromagnetic waves received by the antenna element 140 are supplied to the semiconductor element 120 from the connecting portion 150 through the module board 110. The antenna element 140 receives power from the module board 110 through the connecting portion 150 during signal transmission.

The semiconductor module 100b having the above-described structure is electrically connected to electrode pads 301 of a motherboard (circuit board) 300 by bumps 101 composed of solder or the like, and thereby mounted on the motherboard 300.

Next, an example method of forming the semiconductor module 100b according to the second embodiment will be described with reference to FIGS. 12A to 16B.

Figure 12A:
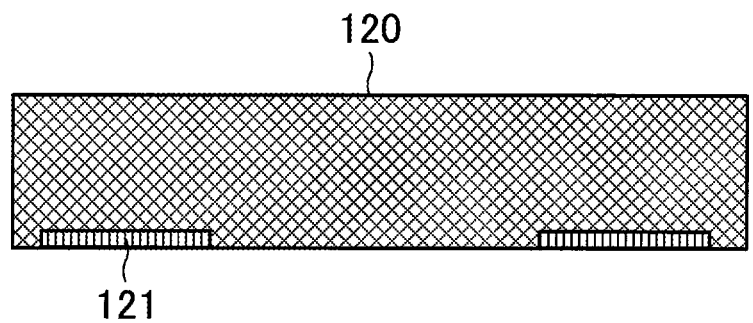
FIGS. 12A to 12C illustrate an example method of forming the semiconductor module according to the second embodiment.
Figure 12B:
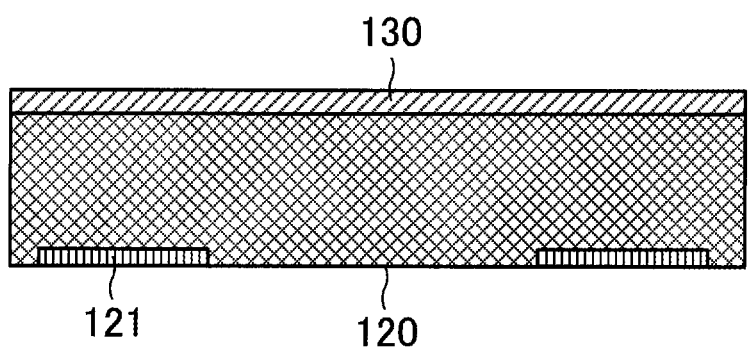
Figure 12C:
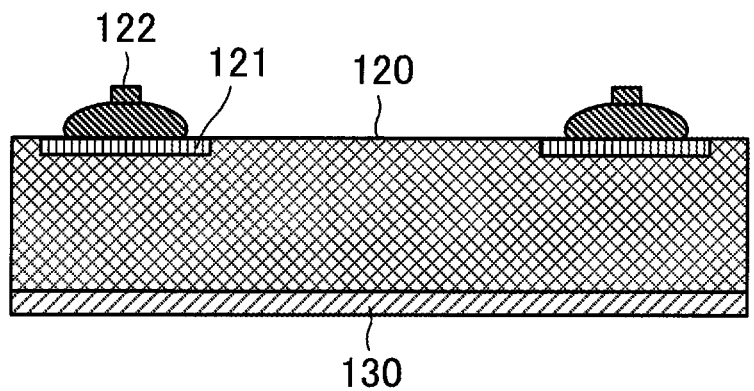

First, a semiconductor element 120 (wafer state) as illustrated in FIG. 12A is prepared. Next, as illustrated in FIG. 12B, a shielding layer 130 is formed on the upper surface (surface of a semiconductor substrate) of the semiconductor element 120. The shielding layer 13 may be, for example, a sheet composed of resin in which magnetic particles are dispersed, a sheet partially or entirely formed of a magnetic layer, or a sheet partially or entirely formed of a metal layer. Subsequently, as illustrated in FIG. 12C, bumps 122 are formed on electrode pads 121 disposed on the lower surface (circuit surface having wiring layers and the like formed thereon) of the semiconductor element 120. The bumps 122 may be formed on the semiconductor element 120 in the wafer state, or may be formed on each semiconductor element 120 separated by dicing. In cases where the bumps 122 are formed on the semiconductor element 120 in the wafer state, the semiconductor element 120 is diced into a plurality of separate semiconductor elements 120 after the bumps 122 are formed.

Next, as illustrated in FIG. 13A, the plurality of semiconductor elements 120, connecting portions 150, and electronic elements 180 such as passive components are mounted on a module board 110. The module board 110 illustrated herein consists of two module boards 110 integrated with each other in the cross-section. For example, joining portions 113 are formed on electrode pads 111 on the module board 110, and the semiconductor elements 120 on which the bumps 122 are formed as described above, the connecting portions 150, and the electronic elements 180 are temporarily mounted on the module board 110. Subsequently, a reflow process is performed so that the components are mounted on the module board 110.

The connecting portions 150 may also be formed by forming a mask layer on the module board 110 on which no components are mounted, the mask layer having openings at positions where the connecting portions 150 are to be formed, by applying a conductive material into the openings by printing or plating, and then by removing the mask layer. The semiconductor elements 120 having the shielding layers 130 formed thereon and the electronic elements 180 are then mounted on the module board 110 on which the connecting portions 150 are formed as above.

After the semiconductor elements 120 having the shielding layers 130 formed thereon, the connecting portions 150, and the electronic elements 180 are mounted on the module board 110, underfill resins 170 are disposed between the module board 110 and the semiconductor elements 120 as illustrated in FIG. 13B. Subsequently, the semiconductor elements 120, the shielding layers 130 formed on the semiconductor elements 120, the connecting portions 150, and the electronic elements 180 are sealed by a sealing resin 160. The placement of the underfill resins 170 may be omitted.

Next, as illustrated in FIG. 14A, the outermost surface of the sealing resin 160 is removed such that the upper ends of the connecting portions 150 covered by the sealing resin 160 are exposed through the sealing resin 160. For example, laser irradiation is performed on the sealing resin 160 to ash and remove the outermost surface of the sealing resin 160. This enables the connecting portions 150 to be exposed through the sealing resin 160. Next, as illustrated in FIG. 14B, resist masks 500 are formed on the sealing resin 160 around the peripheries of the connecting portions 150. The resist masks 500 may be formed by, for example, forming a resist film on the sealing resin 160 through which the connecting portions 150 are exposed and by exposing and developing (patterning) the resist film.

Next, as illustrated in FIG. 15A, a first antenna layer 141 composed of, for example, Cu is formed by electroless plating or vapor deposition. Subsequently, as illustrated in FIG. 15B, the resist masks 500 are removed so that the first antenna layer 141 has a final pattern in which portions formed on the connecting portions 150 are separated from other peripheral portions.

Next, as illustrated in FIG. 16A, a dielectric layer 143 including conductive portions 144 and a second antenna layer 142 are formed on the first antenna layer 141. At this moment, for example, the dielectric layer 143 including the conductive portions 144 is formed on the first antenna layer 141, and subsequently the second antenna layer 142 having a predetermined waveguide pattern is formed thereon. Alternatively, a sheet including the dielectric layer 143 and the second antenna layer 142 formed thereon, the dielectric layer 143 including the conductive portions 144 and the second antenna layer 142 having a predetermined waveguide pattern formed therein, may be produced in advance, and may be bonded onto the first antenna layer 141. This completes the formation of an antenna element 140. Finally, as illustrated in FIG. 16B, separate semiconductor modules 100b are obtained by dicing.

The semiconductor module 100b as illustrated in FIG. 10 is formed through the above-described steps. This semiconductor module 100b is mounted on a motherboard 300.

The semiconductor module 100b having the above-described structure is provided with both a shielding function and an antenna function in a small space on the motherboard 300. For comparison, a semiconductor module of another form will be described with reference to FIG. 17.

Figure 17:
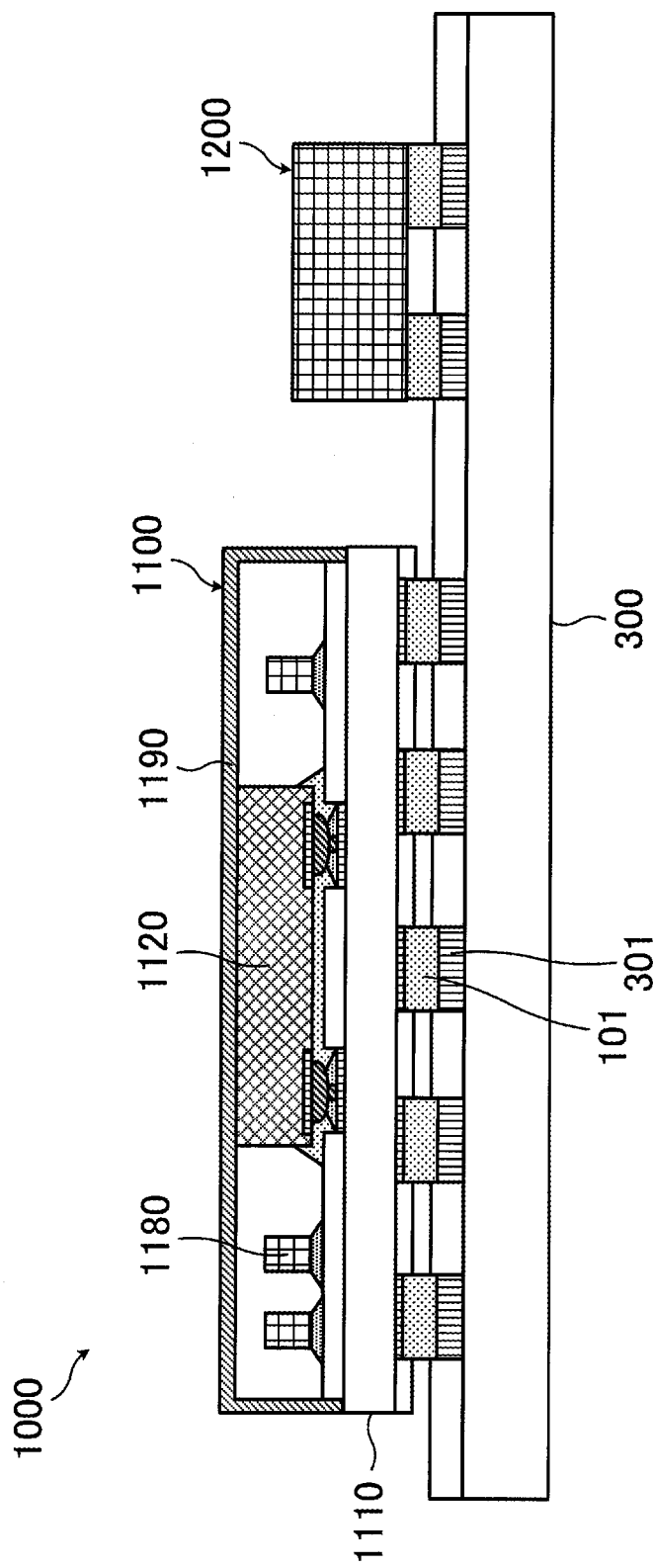
FIG. 17 illustrates a semiconductor module of another form.

In a semiconductor device (electronic apparatus) 1000 illustrated in FIG. 17, a semiconductor module 1100 having a shielding function and an antenna part 1200 are electrically connected to electrode pads 301 of a motherboard 300 by bumps 101 composed of solder or the like, and thereby mounted on the motherboard 300.

The semiconductor module 1100 includes a module board 1110, a semiconductor element 1120 mounted on the module board 1110, electronic elements 1180 such as passive components, and a metal case 1190 for blocking electromagnetic waves. The metal case 1190 covers the semiconductor element 1120 and the electronic elements 1180. The antenna part 1200 is mounted on the motherboard 300 separately from the semiconductor module 1100. The semiconductor element 1120 in the semiconductor module 1100 and the antenna part 1200 are electrically interconnected through the motherboard 300.

In the electronic apparatus 1000 illustrated in FIG. 17, the semiconductor element 1120 and the electronic elements 1180 are shielded from electromagnetic waves by the metal case 1190 whereas the antenna part 1200 is mounted on the motherboard 300 outside the metal case 1190 to receive electromagnetic waves from the outside. Since the semiconductor module 1100 and the antenna part 1200 are mounted on the motherboard 300 in different areas in the electronic apparatus 1000, the motherboard 300 needs a relatively large space to implement both the shielding function and the antenna function.

In contrast, the semiconductor module 100b according to the second embodiment is provided with both the shielding function and the antenna function, and is capable of implementing both functions in a relatively small space on the motherboard 300.

In addition, this semiconductor module 100b does not need complicated processing of components or complicated electrical connection between the components.

The structure and the method of forming the structure according to the second embodiment enable the small semiconductor module 100b having desired properties and reliability to be formed in a relatively simple manner.

Next, a third embodiment will be described.

Figure 18:
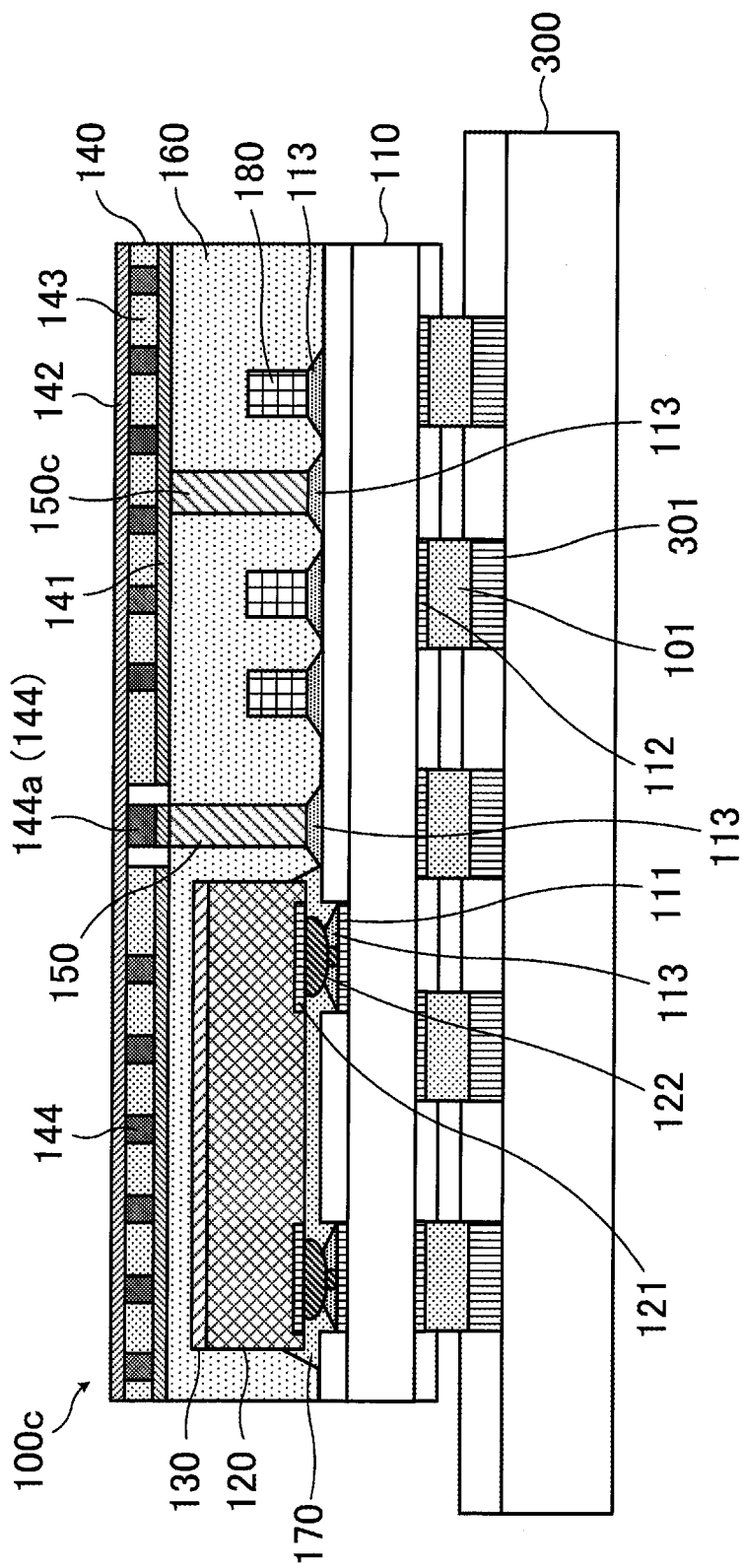
FIG. 18 illustrates an example semiconductor module according to a third embodiment.
Figure 19:
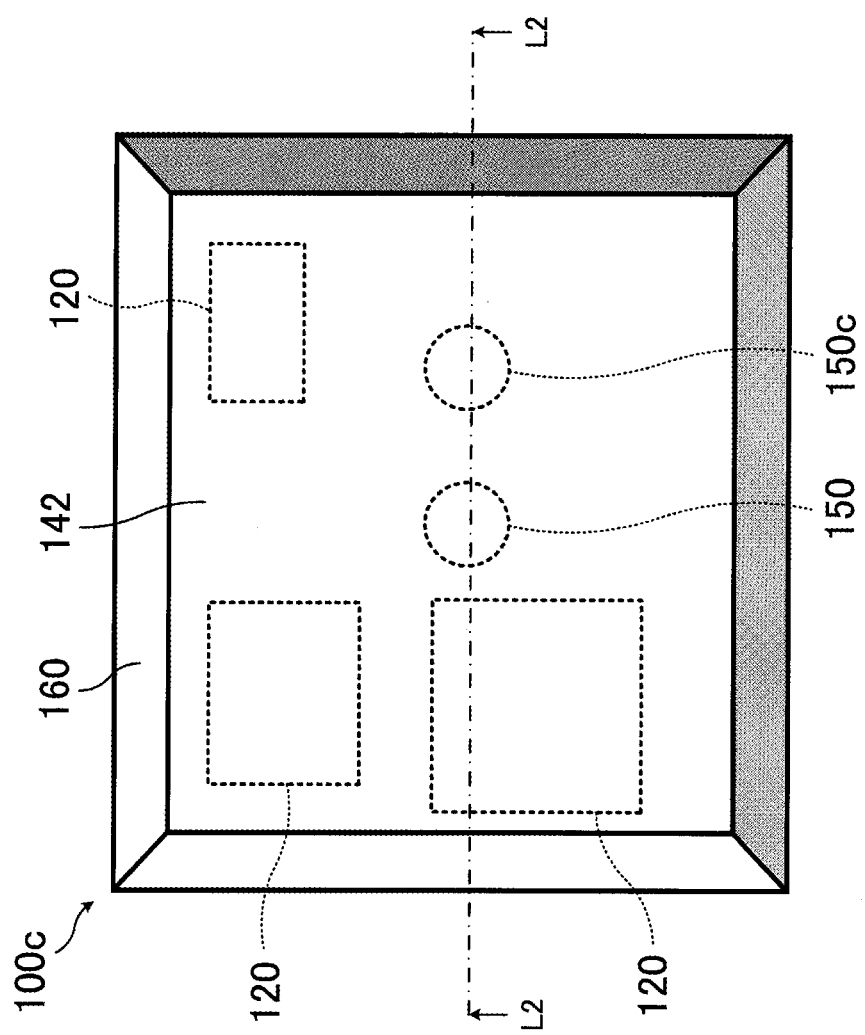
FIG. 19 illustrates the example semiconductor module according to the third embodiment.

FIGS. 18 and 19 illustrate an example semiconductor module according to the third embodiment. FIG. 18 is a schematic cross-section of the semiconductor module according to the third embodiment. FIG. 19 is a schematic top view of the example semiconductor module according to the third embodiment. Herein, FIG. 18 is a schematic cross-section taken along line L2-L2 in FIG. 19.

In a semiconductor module (semiconductor device) 100c illustrated in FIGS. 18 and 19, a module board 110 and a first antenna layer 141 of an antenna element 140 are electrically interconnected by a second connecting portion 150c and one of joining portions 113. The semiconductor module 100c according to the third embodiment differs from the semiconductor module 100b (FIGS. 10 and 11) according to the second embodiment in this respect. The antenna element does not need to include conductive portions 144 (except for a conductive portion 144a) also in this semiconductor module 100c according to the third embodiment.

This semiconductor module 100c enables electrical signals derived from electromagnetic waves in different frequency bands to be supplied to semiconductor elements 120 through the connecting portion 150c and a connecting portion 150. For example, electrical signals of electromagnetic waves in the MHz range may be transmitted and received by the semiconductor elements 120 using the connecting portion 150, and those of electromagnetic waves in the GHz range may be transmitted and received by the semiconductor elements 120 using the connecting portion 150c.

The positions of the connecting portions 150 and 150c may be set on the basis of the layout of the semiconductor elements 120 and electronic elements 180. The size of slots in slot pairs to be formed in a second antenna layer 142 of the antenna element 140 and the layout of the slot pairs, for example, may be set on the basis of the frequencies of electromagnetic waves to be transmitted and received, the layout of the connecting portions 150 and 150c, and other conditions.

The semiconductor module 100c may be formed through a similar procedure for forming the semiconductor module 100b described with reference to FIGS. 12A to 16B. That is, in order to form the semiconductor module 100c having the second connecting portion 150c, the second connecting portion 150c is mounted or formed on the module board 110 as is the first connecting portion 150 in the step illustrated in FIG. 13A. The subsequent steps may be performed similarly to those described above.

The structure and the method of forming the structure according to the third embodiment also enable the small semiconductor module 100c having desired properties and reliability to be formed in a relatively simple manner similarly to the second embodiment.

Next, a fourth embodiment will be described.

Figure 20:
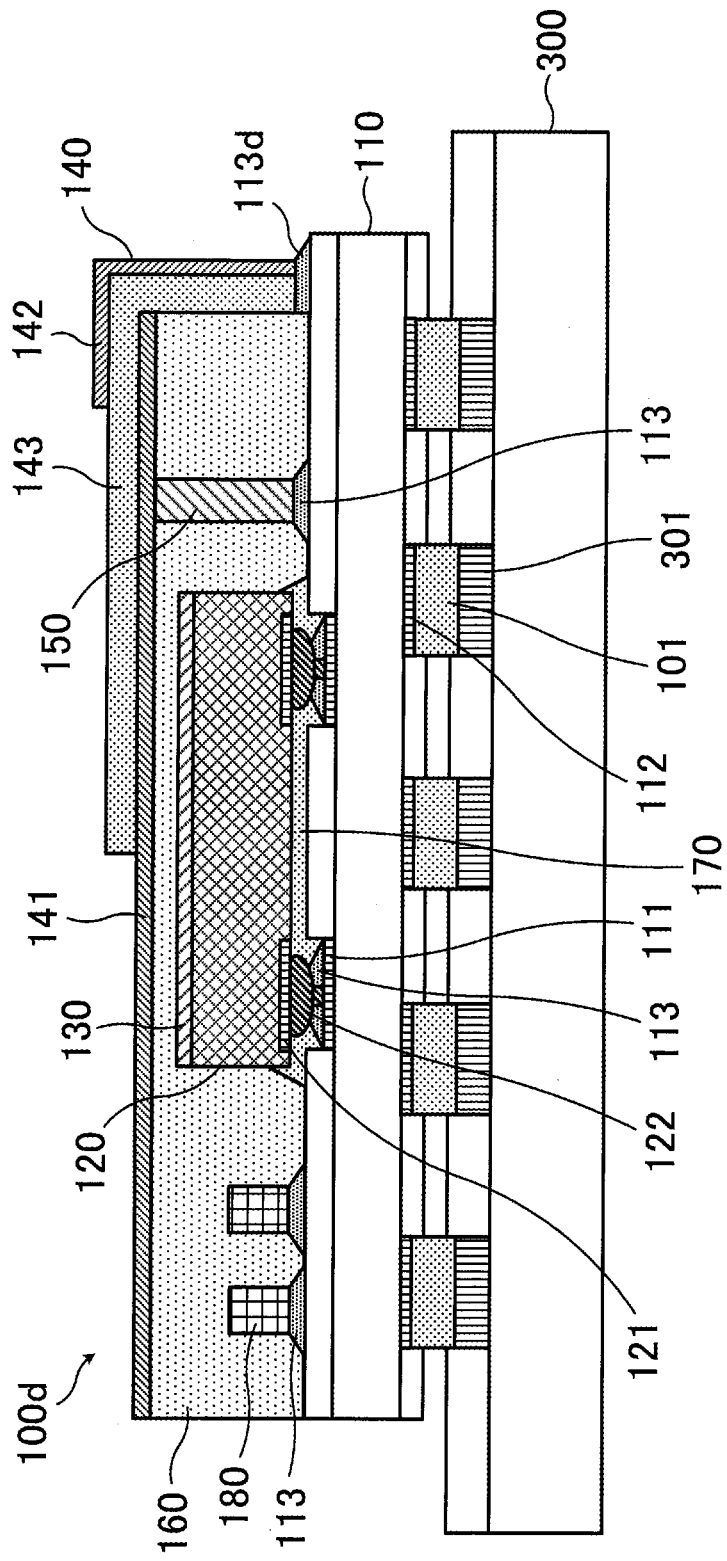
FIG. 20 illustrates an example semiconductor module according to a fourth embodiment.
Figure 21A:
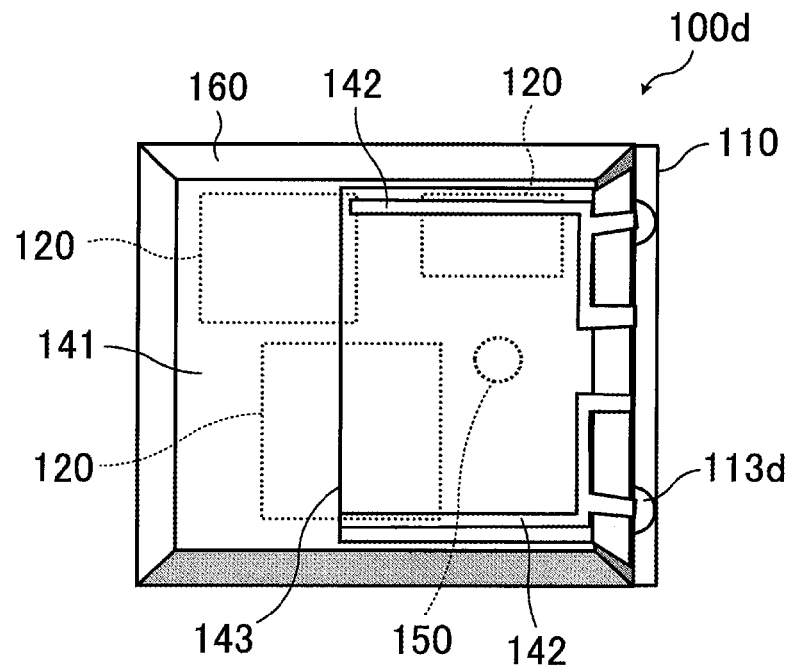
FIGS. 21A and 21B illustrate the semiconductor module according to the fourth embodiment.
Figure 21B:
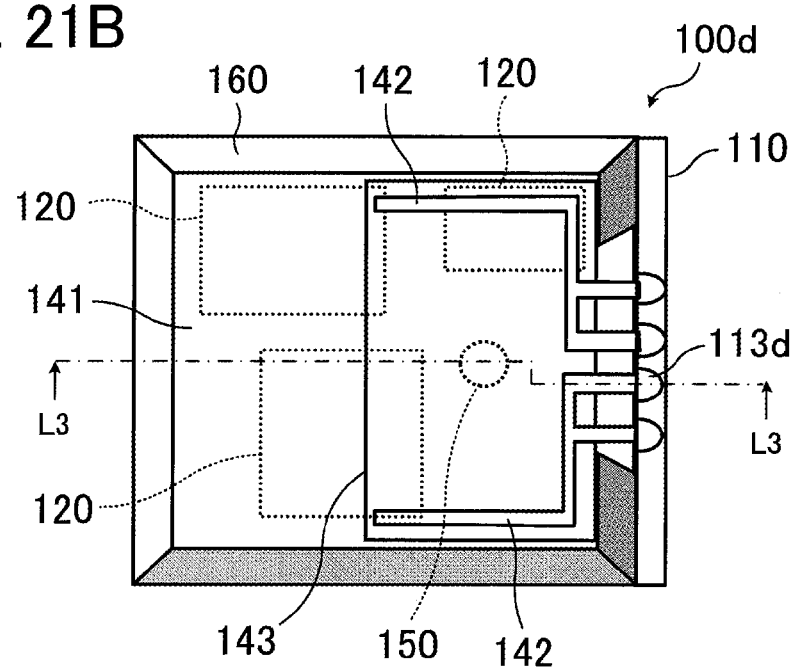

FIGS. 20, 21A, and 21B illustrate an example semiconductor module according to the fourth embodiment. FIG. 20 is a schematic cross-section of the example semiconductor module according to the fourth embodiment. FIGS. 21A and 21B are schematic top views of the example semiconductor module according to the fourth embodiment. Herein, FIG. 20 is a schematic cross-section taken along line L3-L3 in FIG. 21B.

A semiconductor module (semiconductor device) 100d illustrated in FIG. 20 includes a module board 110, semiconductor elements 120, shielding layers 130, an antenna element 140, a connecting portion 150, and a sealing resin 160.

The antenna element 140 of this semiconductor module 100d has a structure described below. That is, the antenna element 140 includes a first antenna layer 141 formed on the sealing resin 160, a dielectric layer 143 formed on a side surface of the sealing resin 160 and on a part of the first antenna layer 141, second antenna layers 142, each having a predetermined waveguide-pattern shape, formed on the dielectric layer 143.

The first antenna layer 141 of the antenna element 140 is electrically connected to the module board 110 by the connecting portion 150. The dielectric layer 143 may be, for example, a resin layer. Various waveguide patterns may be adopted as the shapes of the second antenna layers 142. The waveguide patterns include, for example, linear antenna patterns as illustrated in FIGS. 21A and 21B.

For example, each of the second antenna layers 142 may have a monopole antenna pattern as illustrated in FIG. 21A. An end of each monopole antenna pattern is electrically connected to the module board 110 by one of joining portions 113d composed of solder or the like, and is electrically connected to the corresponding semiconductor element 120 through the module board 110. Alternatively, each of the second antenna layers 142 may have an inverted F-shaped antenna pattern as illustrated in FIG. 21B. Two points of each inverted F-shaped antenna pattern are electrically connected to the module board 110 by the joining portions 113d.

Electrical signals derived from electromagnetic waves received by this antenna element 140 are supplied from the connecting portion 150 and the joining portions 113d to the semiconductor elements 120 through the module board 110. The antenna element 140 receives power through the joining portions 113d and the connecting portion 150 during signal transmission. The gain of power increases when the power is fed in a central portion of the area where the dielectric layer 143 and the second antenna layers 142 are disposed.

In the antenna element 140 according to the fourth embodiment, the second antenna layers 142 are disposed over the first antenna layer 141 with the dielectric layer 143 interposed therebetween. The antenna element 140 becomes capable of transmitting and receiving electrical signals by appropriately designing the dielectric constant and the thickness of the dielectric layer 143 and the layout and the length of the patterns of the second antenna layers 142.

In the antenna element 140 of the semiconductor module 100d having the above-described structure, the first antenna layer 141 connected to the connecting portion 150 is formed on the sealing resin 160, and the dielectric layer 143 and the second antenna layers 142 are formed thereon. For example, a film composed of polyimide or the like is used as the dielectric layer 143, and the second antenna layers 142 having antenna patterns are formed on the film in advance. Subsequently, the dielectric layer 143 having the second antenna layers 142 formed thereon is bonded to the first antenna layer 141 formed on the sealing resin 160 and to a side surface of the sealing resin 160. Predetermined terminals of the second antenna layers 142 are electrically connected to the module board 110 using the joining portions 113d composed of solder or the like. In this manner, the semiconductor module 100d as illustrated in FIGS. 20, 21A, and 21B is obtained.

The structure and the method of forming the structure according to the fourth embodiment also enable the small semiconductor module 100d having desired properties and reliability to be formed in a relatively simple manner.

In accordance with the technology described above, small semiconductor devices having desired properties and reliability are manufactured in a simpler manner.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device comprising:
   a circuit board;
   a semiconductor element mounted on the circuit board;
   a shielding layer including a resin and disposed directly only on an upper surface of the semiconductor element;
   an antenna element disposed over the shielding layer;
   an opening that passes through the shielding layer and reaches inside the semiconductor element;
   a conductive carbide layer disposed on a sidewall portion of the opening in the shielding layer; and
   a connecting portion that is disposed in the opening and passes through the shielding layer to be electrically connected to the semiconductor element and the antenna element.

2. The semiconductor device according to claim 1, wherein the connecting portion includes a through-silicon via.

3. The semiconductor device according to claim 1, wherein the antenna element includes
a first antenna layer including a first metal material and disposed over the shielding layer,
a second antenna layer including a second metal material and disposed over the first antenna layer, and
a dielectric layer disposed between the first antenna layer and second antenna layer.

4. The semiconductor device according to claim 3, wherein the antenna element includes a conductive portion that passes through the dielectric layer.

5. The semiconductor device according to claim 3, wherein the first antenna layer is not patterned, and
the second antenna layer has a waveguide pattern including a plurality of slot pairs arranged in a specific line.

6. The semiconductor device according to claim 1, wherein the antenna element includes
an antenna layer including a metal material and disposed over the shielding layer, and
a dielectric layer disposed between the shielding layer and the antenna layer.

7. The semiconductor device according to claim 1, wherein the shielding layer includes the resin and magnetic particles.

8. The semiconductor device according to claim 1, wherein the shielding layer is apart from the circuit board.

9. The semiconductor device according to claim 1, wherein the antenna element is disposed directly on the shielding layer, and
the connecting portion passes through the shielding layer.

10. A method of manufacturing a semiconductor device, the method comprising:
forming a shielding layer including a resin directly only on an upper surface of a semiconductor element;
forming an opening by laser irradiation so as to pass through the shielding layer and reach inside the semiconductor element;
forming a connecting portion in the opening so as to pass through the shielding layer and so as to be electrically connected to the semiconductor element;
forming an antenna element over the shielding layer so as to be electrically connected to the connecting portion; and
mounting the semiconductor element on a circuit board after the forming of the antenna element; wherein
in the forming of the opening by the laser irradiation, a conductive carbide layer is formed on a sidewall portion of the opening in the shielding layer.

11. The method according to claim 10, wherein the connecting portion includes a through-silicon via that passes through the semiconductor element.

12. The method according to claim 10, wherein
the forming of the antenna element includes forming the antenna element directly on the shielding layer.

* * * * *